(12) United States Patent
Dewey et al.

(10) Patent No.: US 12,720,819 B2
(45) Date of Patent: Aug. 25, 2026

(54) SOURCE OR DRAIN METALLIZATION PRIOR TO CONTACT FORMATION IN STACKED TRANSISTORS

(71) Applicant: Intel Corporation, Santa Clara, CA (US)

(72) Inventors: Gilbert Dewey, Beaverton, OR (US); Cheng-Ying Huang, Hillsboro, OR (US); Nicole K. Thomas, Portland, OR (US); Marko Radosavljevic, Portland, OR (US); Patrick Morrow, Portland, OR (US); Ashish Agrawal, Hillsboro, OR (US); Willy Rachmady, Beaverton, OR (US); Nazila Haratipour, Hillsboro, OR (US); Seung Hoon Sung, Portland, OR (US); I-Cheng Tung, Hillsboro, OR (US); Christopher M. Neumann, Portland, OR (US); Koustav Ganguly, Beaverton, OR (US); Subrina Rafique, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 395 days.

(21) Appl. No.: 17/556,748

(22) Filed: Dec. 20, 2021

(65) Prior Publication Data

US 2023/0197777 A1 Jun. 22, 2023

(51) Int. Cl.
*H10D 62/10* (2025.01)
*H10D 30/00* (2025.01)
(Continued)

(52) U.S. Cl.
CPC ......... *H10D 62/118* (2025.01); *H10D 30/014* (2025.01); *H10D 30/43* (2025.01);
(Continued)

(58) Field of Classification Search
CPC .... H10D 88/00; H10D 88/01; H10D 84/8312; H10D 84/832; H10D 84/851;
(Continued)

(56) References Cited

U.S. PATENT DOCUMENTS

2020/0006329 A1 1/2020 Lilak et al.
2020/0126987 A1 4/2020 Rubin et al.
(Continued)

OTHER PUBLICATIONS

Extended European Search Report received for EP Application No. 22198962.7 dated May 11, 2023. 9 pages.

*Primary Examiner* — Marcos D. Pizarro
(74) *Attorney, Agent, or Firm* — Arcane Law PLLC

(57) ABSTRACT

Techniques are provided herein to form gate-all-around (GAA) semiconductor devices utilizing a metal fill in an epi region of a stacked transistor configuration. In one example, an n-channel device and the p-channel device may both be GAA transistors each having any number of nanoribbons extending in the same direction where the n-channel device is located vertically above the p-channel device (or vice versa). Source or drain regions are adjacent to both ends of the n-channel device and the p-channel device. A metal fill may be provided around the source or drain region of the bottom semiconductor device to provide a high contact area between the highly conductive metal fill and the epitaxial material of that source or drain region. Metal fill may also be used around the top source or drain region to further improve conductivity throughout both of the stacked source or drain regions.

19 Claims, 21 Drawing Sheets

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/13*** | (2025.01) |
| ***H10D 64/01*** | (2025.01) |
| ***H10D 64/23*** | (2025.01) |
| ***H10D 84/83*** | (2025.01) |
| ***H10D 84/85*** | (2025.01) |
| ***H10D 88/00*** | (2026.01) |

(52) U.S. Cl.
CPC ......... *H10D 30/501* (2025.01); *H10D 30/502* (2025.01); *H10D 30/503* (2025.01); *H10D 30/6713* (2025.01); *H10D 30/6735* (2025.01); *H10D 30/6757* (2025.01); *H10D 62/121* (2025.01); *H10D 62/151* (2025.01); *H10D 64/017* (2025.01); *H10D 64/251* (2025.01); *H10D 84/8312* (2025.01); *H10D 84/832* (2025.01); *H10D 84/851* (2025.01); *H10D 88/00* (2025.01); *H10D 88/01* (2025.01)

(58) Field of Classification Search
CPC ................. H10D 30/014; H10D 30/43; H10D 30/501–503; H10D 30/6713; H10D 30/6735; H10D 64/017; H10D 64/251; H10D 62/121; H10D 62/151
See application file for complete search history.

(56) References Cited

U.S. PATENT DOCUMENTS

| | | | | |
|---|---|---|---|---|
| 2020/0294969 | A1 | 9/2020 | Rachmady et al. | |
| 2023/0064635 | A1* | 3/2023 | Huang | H10D 30/031 |
| 2023/0065715 | A1* | 3/2023 | Xie | H10D 84/038 |

* cited by examiner

SOURCE OR DRAIN METALLIZATION PRIOR TO CONTACT FORMATION IN STACKED TRANSISTORS

FIELD OF THE DISCLOSURE

The present disclosure relates to integrated circuits, and more particularly, to the epi region contact formation for transistor devices.

BACKGROUND

As integrated circuits continue to scale downward in size, a number of challenges arise. For instance, reducing the size of memory and logic cells or otherwise increasing device density is becoming increasingly more difficult. One possible solution to increase device density is to stack transistor devices in a vertical direction. As a result, providing contacts to the structures of such stacked devices becomes difficult. There are many non-trivial challenges involved with the fabrication of such stacked devices and the fabrication of contacts to the associated device structures.

Figure 1A:
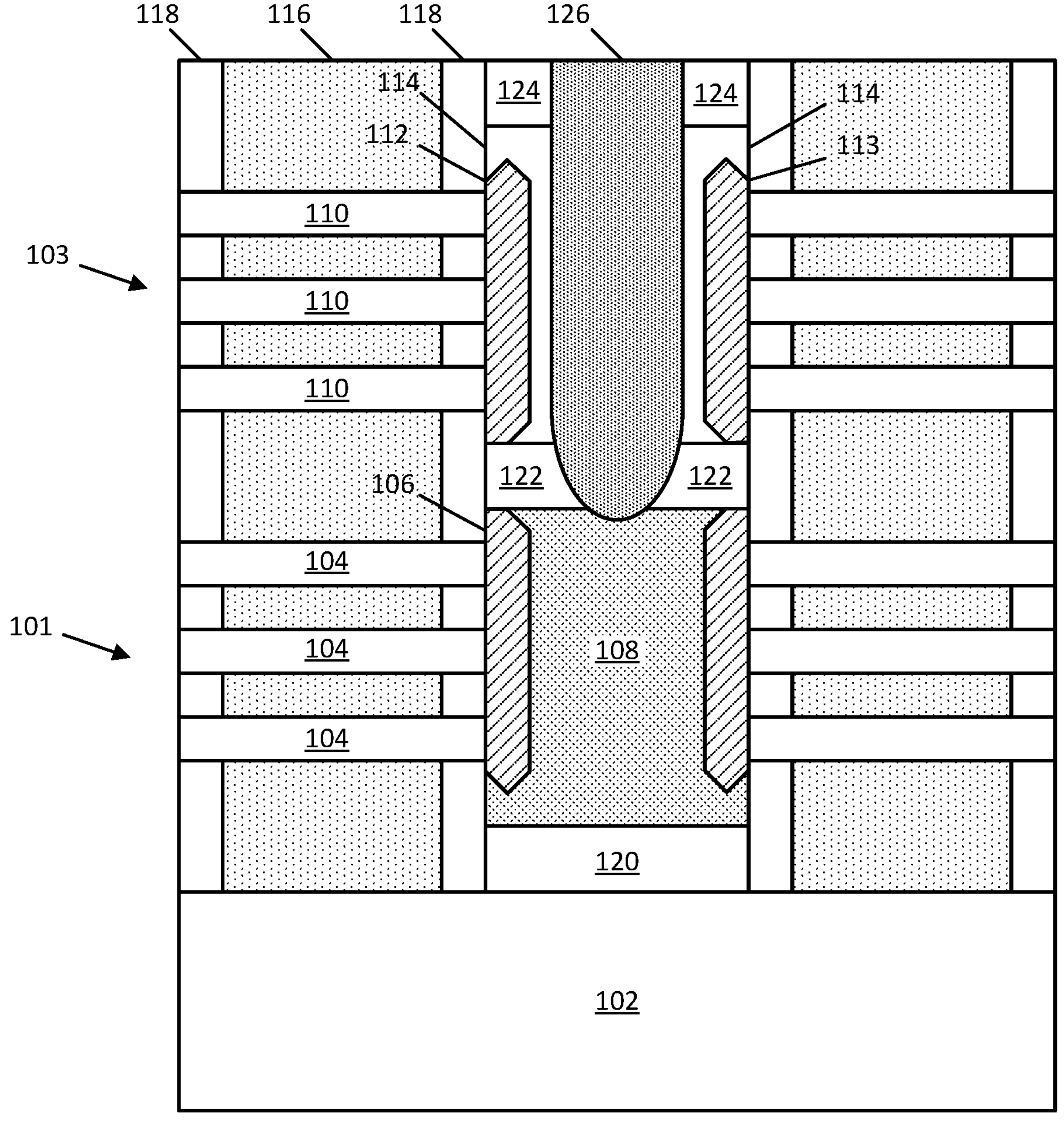
FIG. 1A is a cross-sectional view of an example integrated circuit having a semiconductor device with a particular contact structure in the epitaxial source or drain region (epi region), in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form gate-all-around (GAA) semiconductor devices utilizing a metal fill in an epitaxial source or drain region (epi region) of a stacked transistor configuration. The techniques can be used in any number of transistor technologies, but are particularly useful in a stacked nanoribbon transistor configuration (e.g., stacked in a vertical z-direction from the substrate surface). In one example, two different semiconductor devices of a given memory or logic cell such as a synchronous random access memory (SRAM) cell, or a complementary metal oxide semiconductor (CMOS) cell, include a p-channel device and an n-channel device. More specifically, the n-channel device and the p-channel device may both be GAA transistors each having any number of nanoribbons extending in the same direction where the n-channel device is located vertically above the p-channel device (or vice versa). Source or drain regions are adjacent to both ends of the n-channel device and the p-channel device, such that a source or drain region of one device is located vertically over the source or drain region of the other device. A metal fill may be provided around the source or drain region of the bottom semiconductor device to provide a high contact area between the highly conductive metal fill and the epitaxial material of that source or drain region. Furthermore, a topside contact can make a low resistance connection to the bottom source or drain region by contacting the metal fill. The use of metal fill around the bottom source or drain region also simplifies the formation of a backside contact to the metal fill to provide backside signaling to the bottom source or drain region. Metal fill may also be used around the top source or drain region to further improve conductivity throughout both of the stacked source or drain regions. Numerous variations and embodiments will be apparent in light of this disclosure.

General Overview

As previously noted above, there remain a number of non-trivial challenges with respect to designing gate-all-around (GAA) semiconductor devices. In the case of stacked nanoribbon transistors, for example, the stacked structures can cause complications for providing electrical contact to the lower structures. For example, source or drain epi regions may be stacked over one another with an insulative barrier layer between them. In order to contact the lower source or drain epi region, a narrow contact may be formed from the frontside through the top source or drain region and through the barrier layer to also contact the bottom source or drain region. However, the contact area between the contact and the bottom source or drain region is small compared to the top source or drain region, which can cause problems with the device operation. Furthermore, forming such a deep and narrow contact brings numerous fabrication challenges, including causing damage to sensitive portions of the bottom source or drain region that further increases the contact resistance.

Thus, and in accordance with an embodiment of the present disclosure, techniques are provided herein to form a metal fill around the bottom source or drain region that provides greater contact area around that source or drain region. Additionally, a topside contact can be formed that lands on or otherwise touches the metal fill, thus alleviating the need to form a very deep contact. According to some embodiments, the metal fill may be formed after the formation of the bottom source or drain region that substantially fills a trench-like area around the bottom source or drain region. The metal fill may include, for example, any non-reactive metal such as a refractory metal like tungsten (W), molybdenum (Mo), ruthenium (Ru), or cobalt (Co). The non-reactive metal fill does not react with the adjacent bottom source or drain region to form any silicide or germanide at the edges of the metal fill. In some examples, non-reactive metal compounds such as molybdenum silicide (MoSi) or tantalum silicide (TaSi) may be formed in a gaseous state and deposited as the metal fill without further reacting with the epi material in the bottom source or drain region. A frontside contact may be formed through a top source or drain region and deep enough to contact a top surface of the bottom metal fill. In some embodiments, a metal fill is also used around the top source or drain region and a shallower topside contact is used to contact the metal fill. According to some embodiments, the metal fill may be formed by first depositing the metal material using a physical vapor deposition (PVD) process to provide an initial layer around the bottom source or drain region and then fill the remaining area around the source or drain region with the metal material using a chemical vapor deposition (CVD) process. This deposition procedure may be used to minimize or eliminate fluorine contamination of the epitaxial material during CVD.

According to some embodiments, the use of a metal fill around the bottom source or drain region also provides advantages for backside contacts. Forming deep backside contacts can be challenging, but with the presence of the metal fill, a backside contact only needs to be made deep enough to touch any portion of the metal fill in order to provide an electrical connection with the bottom source or drain region. Although description herein focuses on the use of GAA transistor configurations, the techniques can be applied to other channel configurations as well, such as finFETs, stacked finFETs, or horizontally stacked trigate FET devices.

According to an embodiment, an integrated circuit includes a first semiconductor device having one or more first semiconductor nanoribbons extending in a first direction between a first source or drain region and a second source or drain region and a second semiconductor device having one or more second semiconductor nanoribbons extending in the first direction between a third source or drain region and a fourth source or drain region. The one or more first semiconductor nanoribbons are spaced vertically from the one or more second semiconductor nanoribbons in a second direction different from the first direction and the third source or drain region is spaced vertically from the first source or drain region in the second direction. The integrated circuit also includes an insulator layer between the first source or drain region and the third source or drain region, a conductive fill comprising a metal and contacting at least a portion of the first source or drain region and at least a portion of the insulator layer, and a conductive contact that extends through a thickness of the third source or drain region and contacts a portion of the conductive fill.

According to another embodiment, an integrated circuit includes a first semiconductor device having one or more first semiconductor nanoribbons extending in a first direction and a second semiconductor device having one or more second semiconductor nanoribbons extending in the first direction. The one or more first semiconductor nanoribbons are spaced vertically from the one or more second semiconductor nanoribbons in a second direction different from the first direction. The integrated circuit also includes a first source or drain epitaxial region on an end of at least one of the one or more first semiconductor nanoribbons, a second source or drain epitaxial region on an end of at least one of the one or more second semiconductor nanoribbons, a conductive fill comprising a metal and around both the first source or drain epitaxial region and the second source or drain epitaxial region, and a conductive via that contacts a portion of the conductive fill.

According to another embodiment, a method of forming an integrated circuit includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a first source or drain region coupled to the ends of the second material layers; forming a conductive fill comprising a metal and contacting at least a portion of the first source or drain region; forming an insulating layer over the conductive fill; forming a second source or drain region coupled to the ends of the fourth material layers and over the insulating layer; and forming a conductive contact through a thickness of the second source or drain region and through at least a portion of the insulating layer, such that the conductive contact contacts the conductive fill.

According to another embodiment, a method of forming an integrated circuit includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a first source or drain region coupled to at least one of the ends of the second material layers; forming a first conductive fill comprising a metal and contacting at least a portion of the first source or drain region; forming a second source or drain region coupled to at least one of the ends of the fourth material layers; and forming a second conductive fill comprising the metal and contacting at least a portion of the second source or drain region and the first conductive fill.

The techniques are especially suited for use with gate-all-around transistors such as nanowire and nanoribbon transistors but may also be applicable in some instances to finFET devices (e.g., stacked finFET structures). The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate electrode can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate a metal fill around epitaxially grown source or drain region regions. In some examples, the source or drain regions include small nubs or islands of epitaxially grown material off of the ends of semiconductor nanoribbons. Accordingly, the metal fill may be present around and between the epitaxially grown nubs or islands. Material analysis may be used to show that the metal fill contains a non-reactive metal throughout the entire body of the metal fill. Examples of such non-reactive metals include W, Mo, Ru, or Co.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view of a portion of an integrated circuit that includes a first semiconductor device 101 and a second semiconductor device 103, where second semiconductor device 103 is stacked vertically over first semiconductor device 101, according to an embodiment of the present disclosure. The cross section view is taken lengthwise (perpendicular to gate structure) across first semiconductor device 101 and second semiconductor device 103 in a first direction while the devices are vertically stacked over one another in a second direction substantially orthogonal to the first direction. Each of semiconductor devices 101 and 103 may be gate-all-around (GAA) transistors, although other transistor topologies and types could also benefit from the techniques provided herein. The illustrated embodiments herein use the GAA structure. Semiconductor devices 101 and 103 represent a portion of the integrated circuit that may contain any number of similar semiconductor devices. While other semiconductor devices may be illustrated, such as the stacked devices on the right of FIG. 1A, reference herein is made to the structures of semiconductor devices 101 and 103 for ease of discussion. The description of such structures may apply equally to the corresponding structures of other stacked semiconductor devices in the integrated circuit.

As can be seen, the integrated circuit is formed over a substrate 102. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

In some embodiments, substrate 102 is removed during backside processing and replaced with a dielectric base layer. Backside interconnect structures such as backside contacts may be formed through the dielectric base layer to contact semiconductor device structures from below.

First semiconductor device 101 may include any number of semiconductor nanoribbons 104 extending between a first source or drain region 106 and a second source or drain region (not illustrated). According to some embodiments, first source or drain region 106 includes epitaxially grown material from the ends of nanoribbons 104. In some examples, first source or drain region 106 represents individual nubs or islands of epitaxial material grown from the ends of each of semiconductor nanoribbons 104, such that the epitaxial growths do not all merge together. In some examples, like the one illustrated, such epitaxial growths from the ends of each of semiconductor nanoribbons 104 merge together along the side of the device.

According to some embodiments, a metal fill 108 surrounds first source or drain region 106. In an example where first source or drain region 106 represents individual epitaxial nubs, metal fill 108 may surround each nub such that it is present between the nubs along the side of first semiconductor device 101. According to some embodiments, metal fill 108 includes a continuous body of refractory metal, such as ruthenium (Ru), tungsten (W), cobalt (Co), or molybdenum (Mo). Such refractory metals do not react with the adjacent source or drain material, and thus no silicide or germanide forms at the boundary between metal fill 108 and the epitaxial material of first source or drain region 106. According to some embodiments, the refractory metal of metal fill 108 directly contacts the epitaxial material of first source or drain region 106.

In some embodiments, metal fill 108 includes any suitable non-reactive metal or metal compound. For example, some metal silicides like MoSi or TaSi can be reacted together in a gaseous state and deposited as metal fill 108. Since the compounds have already reacted, no further reaction takes place with the epi material of the source or drain regions. Accordingly, metal fill 108 may include a consistent material composition of either a single refractory metal or non-reactive metal compound throughout the body of the metal fill 108 with no material gradient present at the interface between metal fill 108 and the epi material of first source or drain region 106.

Second semiconductor device 103 may include any number of semiconductor nanoribbons 110 extending between a third source or drain region and a fourth source or drain region (not illustrated). According to some embodiments, the third source or drain region includes epitaxially grown material that is shared between semiconductor nanoribbons 110 of second semiconductor device 103 and semiconductor nanoribbons of an adjacent semiconductor device. According to some embodiments, the third source or drain region includes different epitaxial regions. For example, the third source or drain region includes first epitaxial portions 112 and 113 that are grown directly from the tips of semiconductor nanoribbons 110 and the semiconductor nanoribbons of the adjacent device, respectively, and a second epitaxial portion 114 that fills in the remaining area around the first epitaxial portions 112/113. In some examples, first epitaxial portion 112 represents individual nubs or islands of epitaxial material grown from the ends of each of semiconductor nanoribbons 110, such that the epitaxial growths do not all merge together. In some examples, like the one illustrated, such epitaxial growths from the ends of each of semiconductor nanoribbons 110 merge together along the side of the device. According to some embodiments, second epitaxial portion 114 is formed over first epitaxial portions 112 and 113 and has a higher dopant concentration compared to first epitaxial portions 112 and 113.

Any of the source or drain regions may act as either a source region or a drain region, depending on the application and dopant profile. In some embodiments, semiconductor devices 101 and 103 have an equal number of nanoribbons, while in other embodiments they have an unequal number of nanoribbons. In some embodiments, each of nanoribbons 104 and nanoribbons 110 are formed from a fin of alternating material layers (e.g., alternating layers of silicon and silicon germanium) where sacrificial material layers are removed between nanoribbons 104 and nanoribbons 110. Each of nanoribbons 104 and nanoribbons 110 may include the same semiconductor material as underlying substrate 102 (which may be later removed to form a base dielectric layer.) In any such cases, and according to some embodiments, a vertical distance between about 10 nm and about 80 nm separates the nanoribbons 104 of first semiconductor device 101 from the nanoribbons 110 of second semiconductor device 103. Other embodiments may have a smaller or larger such vertical distance.

Any semiconductor materials suitable for source and drain regions can be used (e.g., group IV and group III-V semiconductor materials) for any of the illustrated source or drains regions. In any such cases, the composition and doping of the source and drain regions may be the same or different, depending on the polarity of the transistors. In an example, for instance, first semiconductor device 101 is a p-type MOS (PMOS) transistor having a high concentration of p-type dopants in first source or drain region 106, and second semiconductor device 103 is an n-type MOS (NMOS) transistor having a high concentration of n-type dopants in the third source or drain region (composed of first epitaxial portions 112/113 and second epitaxial portion 114). Any number of source and drain configurations and materials can be used.

A gate structure 116 is provided over each of nanoribbons 104 and nanoribbons 110 in a shared gate architecture, according to some embodiments. In some other embodiments, a dielectric layer is present between nanoribbons 104 and nanoribbons 110 to produce a split gate architecture where a first gate structure around nanoribbons 104 is electrically isolated from a second gate structure around nanoribbons 110. The embodiments illustrated herein use the shared gate architecture but are equally applicable to split gate architectures.

Spacer structures 118 are included on either side of gate structure 116. Spacer structures 118 may include a dielectric material, such as silicon nitride, silicon oxynitride, or silicon oxycarbonitride. Gate structure 116 includes both a gate dielectric around each of nanoribbons 104 and nanoribbons 110 and a gate electrode over the gate dielectric. The gate dielectric may include a single material layer or multiple material layers. In some embodiments, the gate dielectric includes a first dielectric layer such as an oxide native to nanoribbons 104 and 110 (e.g., silicon oxide) and a second dielectric layer that includes a high-k material (e.g., such as hafnium oxide). The high-k dielectric material may be doped with an element to affect the threshold voltage of the given semiconductor device. In other embodiments, the gate dielectric only includes high-k dielectric material; in still other embodiments, the gate dielectric only includes regular-k dielectric material (e.g., silicon oxide). In some embodiments, the gate dielectric around nanoribbons 104 has a different element doping concentration compared to the gate dielectric around nanoribbons 110. According to some embodiments, the doping element used in the gate dielectric is lanthanum.

According to some embodiments, the gate electrode extends over the gate dielectric around each of nanoribbons 104 and nanoribbons 110 and also generally fills the remaining space between the various nanoribbons of any number of stacked semiconductor devices. The gate electrode may include any sufficiently conductive material such as a metal, metal alloy, or doped polysilicon. In some embodiments, the gate electrode includes one or more workfunction metals around nanoribbons 104 and 110. In some embodiments, semiconductor device 101 is a p-channel device that includes n-type dopants within nanoribbons 104 and includes a workfunction metal having titanium around nanoribbons 104 and semiconductor device 103 is an n-channel device that includes p-type dopants within nanoribbons 110 and includes a workfunction metal having tungsten around nanoribbons 110. N-type dopants may also be used within the nanoribbons of an n-channel device and p-type dopants may be used within the nanoribbons of a p-channel device in order to tune the transistor's threshold voltage. The gate electrode may also include a fill metal or other conductive material around the workfunction metals to provide the whole gate electrode structure. According to some embodiments, the gate structure may be interrupted between any adjacent semiconductor devices in a third direction orthogonal to both the first and second directions by a gate cut structure.

Returning to the epitaxial regions adjacent to the nanoribbons, a bottom dielectric layer 120 may be present to isolate first source or drain region 106 from any underlying substrate or underlying material. A middle dielectric layer 122 may be present between first source or drain region 106 and the third source or drain region in the vertical direction to isolate the regions from one another. A top dielectric layer 124 may be present over the third source or drain region. Each of bottom dielectric layer 120, middle dielectric layer 122, and top dielectric layer 124 may be any suitable dielectric material, such as silicon oxide, silicon oxynitride, or silicon oxycarbonitride.

According to some embodiments, a conductive contact 126 may be formed that extends vertically (e.g., in the second direction) through at least the first source or drain region and middle dielectric layer 122. According to some embodiments, conductive contact 126 touches any portion of a top surface of metal fill 108 to provide electrical connection to first source or drain region 106. Conductive contact 126 may include any conductive material such as copper (Cu), ruthenium (Ru), tungsten (W), cobalt (Co), titanium (Ti), molybdenum (Mo), or any alloys thereof. In some embodiments, conductive contact 126 includes one or more layers of different conductive materials, such as a liner that includes titanium silicide, tantalum silicide, titanium germanide, tantalum germanide, nitrogen germanide, or nitrogen silicide and a fill material that includes tungsten, ruthenium, molybdenum, or cobalt, to name a few examples. The silicide or germanide (or other semiconductor-metal layer that forms at the semiconductor-metal interface) that may form at the edges of conductive contact 126 can consume a portion of the epitaxial material, which is why it is desirable for conductive contact 126 to not contact any of first epitaxial portion 112 of the third source or drain region, according to some embodiments. Another relatively thin layer that may be provided is an adhesion layer, such as a layer of titanium nitride (TiN) or tantalum nitride (TaN). Such liner and adhesion layers can be considered part of an overall conductive contact structure 126 that includes one or more bodies of conductive fill material and possibly one or more relatively thin layers (e.g., such as TaN, TiN, silicide, germanide, or other resistance-reducing layers). The relatively thin layers, if present, may exist at the periphery of the given body of fill material, and have a thickness in the range of one to several monolayers to about 2 nanometers (nm), according to some embodiments.

According to some embodiments, conductive contact 126 includes a continuous body of refractory metal, such as ruthenium (Ru), tungsten (W), cobalt (Co), or molybdenum (Mo). Such refractory metals do not react with the adjacent source or drain material, and thus no silicide or germanide forms at the boundary between conductive contact 126 and the epitaxial material of the third source or drain region. The refractory metal used in conductive contact 126 may be the same refractory metal used in fill metal 108. Accordingly, in some embodiments, no seam will be present between conductive contact 126 and metal fill 108 while in other embodiments, a seam may be visible between the two metal structures due to different metal materials and/or deposition processes.

According to some embodiments, the refractory metal of the conductive contact directly contacts the epitaxial material of the third source or drain region. According to some embodiments, the refractory metal of the conductive contact 126 does not contact any of first epitaxial portions 112/113 of the third source or drain region.

In some embodiments, conductive contact 126 includes any suitable non-reactive metal or metal compound. For example, some metal silicides like MoSi or TaSi can be reacted together in a gaseous state and deposited as conductive contact 126. Since the compounds have already reacted, no further reaction takes place with the epi material of the source or drain regions. Accordingly, conductive contact 126 may include a consistent material composition of either a single refractory metal or non-reactive metal compound throughout the body of the conductive contact 126 with no material gradient present at the interface between conductive contact 126 and the epi material of the source or drain regions. Due to the fabrication procedure, as will be described in more detail herein, conductive contact 126 may have a tapered end.

Figure 1B:
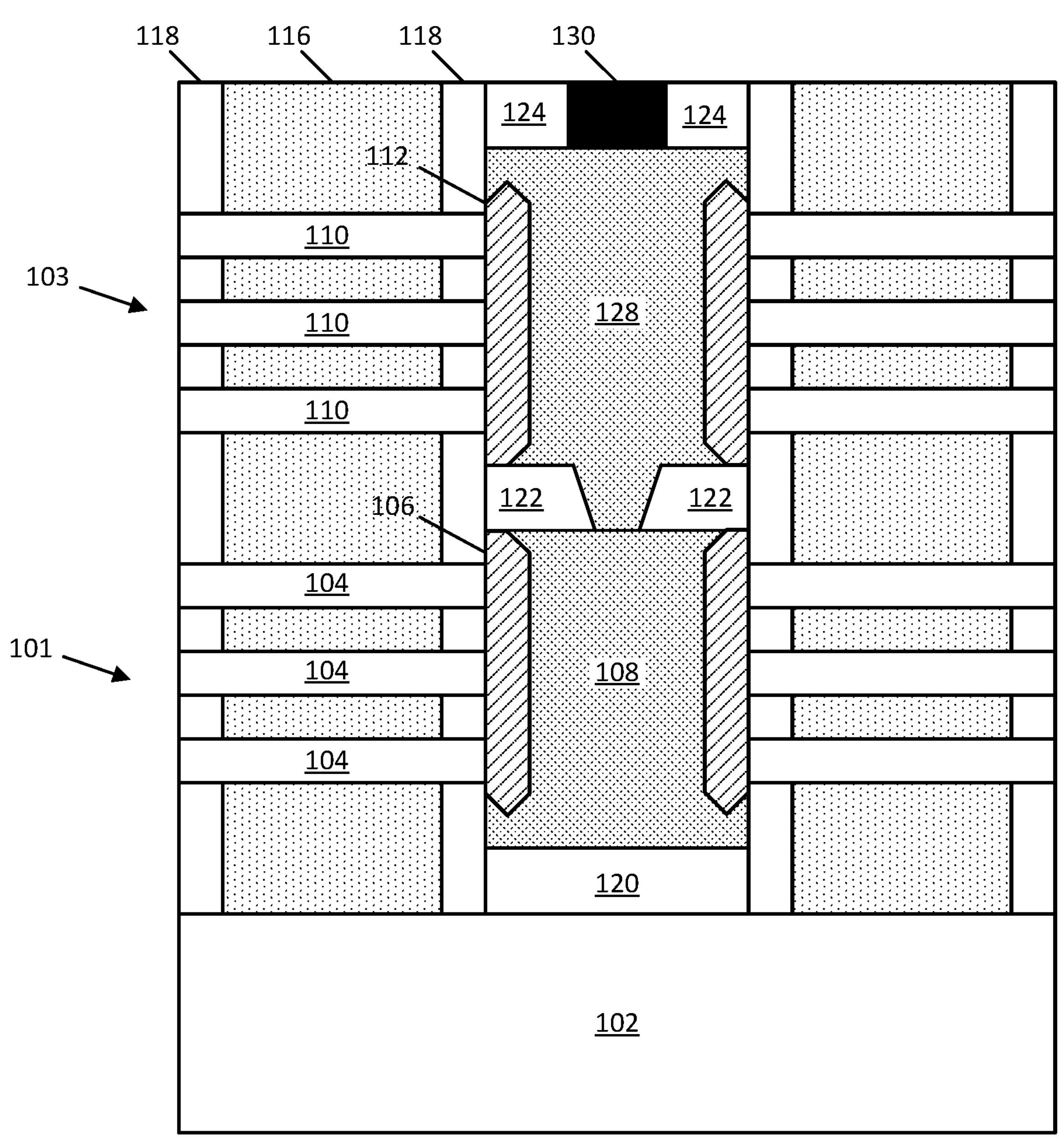
FIG. 1B is a cross-sectional view of an example integrated circuit having a semiconductor device with a different contact structure in the epi region, in accordance with an embodiment of the present disclosure.

FIG. 1B is a cross sectional view of another portion of an integrated circuit that includes first semiconductor device 101 and second semiconductor device 103 having a different contact structure in the epitaxial source or drain regions, according to an embodiment. Compared to the integrated circuit portion illustrated in FIG. 1A, the portion in FIG. 1B also includes a metal fill 128 around first epitaxial portions 112/113 of the third source or drain region. In the absence of the second epitaxial portion, first epitaxial portion 112 may be considered to be the third source or drain region at the ends of nanoribbons 110.

According to some embodiments, all of the above discussion related to metal fill 108 may apply to metal fill 128. Accordingly, metal fill 128 may be a refractory metal, such as the same refractory metal as metal fill 108. Thus, in some embodiments, no seam will be present between metal fill 128 and metal fill 108 while in other embodiments, a seam may be visible between the two metal structures due to different metal materials and/or deposition processes. According to some embodiments, metal fill 128 may extend through a thickness of middle dielectric layer 122 to contact at least a portion of the top surface of metal fill 108. In some embodiments, middle dielectric layer 122 is omitted such that metal fill 128 is on the entire top surface of metal fill 108.

According to some embodiments, a metal via 130 may be formed through top dielectric layer 124 to contact at least a portion of metal fill 128. Metal via 130 may be any suitable conductive material.

Figure 1C:
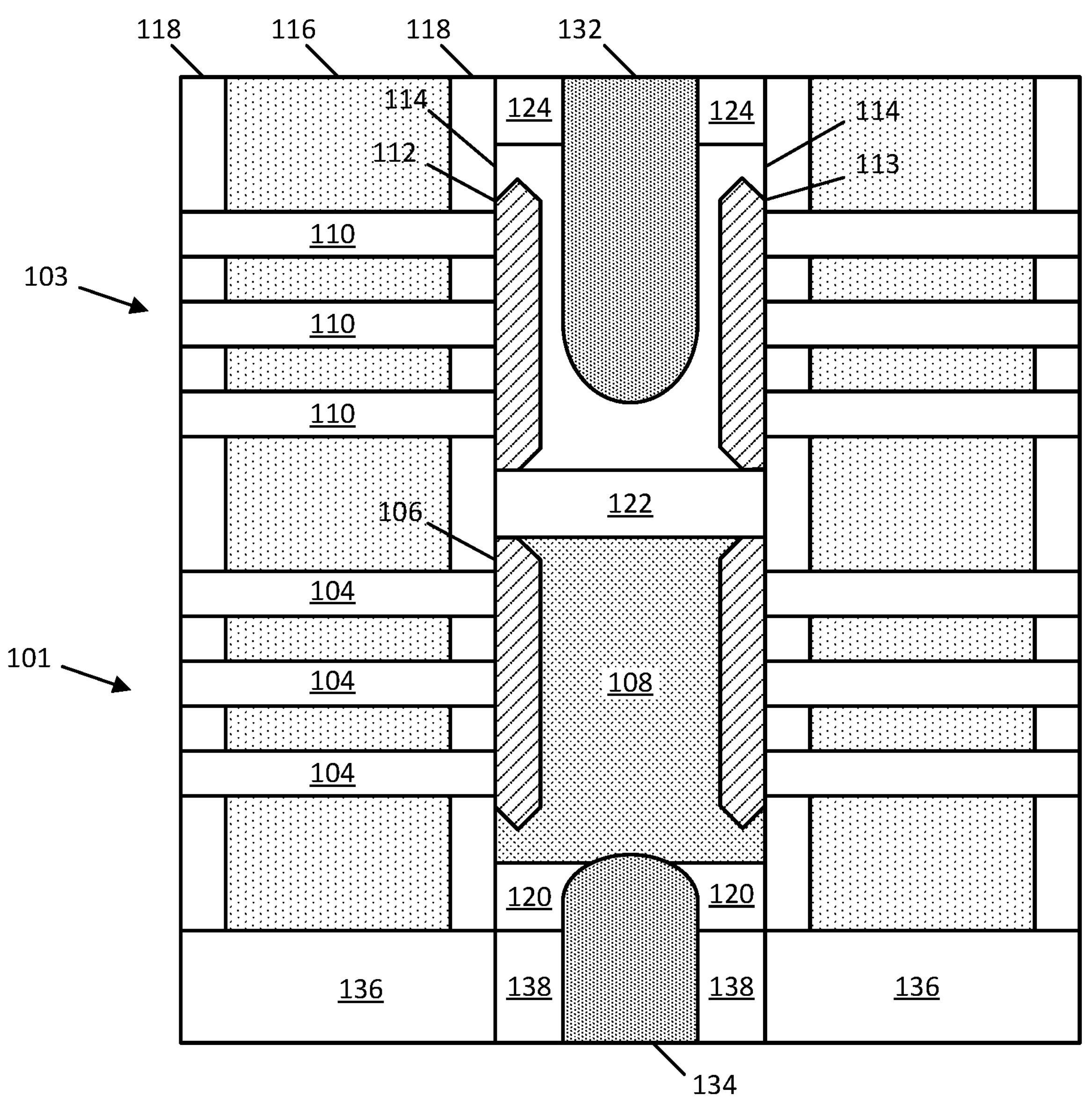
FIG. 1C is a cross-sectional view of an example integrated circuit having a semiconductor device with a backside contact structure in the epi region, in accordance with an embodiment of the present disclosure.

FIG. 1C is a cross sectional view of another portion of an integrated circuit that includes first semiconductor device 101 and second semiconductor device 103 having a separate frontside contact 132 and a backside contact 134 touching metal fill 108, according to an embodiment. Frontside contact 132 may have any of the metal materials as described above for conductive contact 126. However, frontside contact 132 may be formed through only a portion of a thickness of the third source or drain region. For example, frontside contact 132 may not reach deep enough to penetrate any portion of middle dielectric layer 122.

According to some embodiments, backside contact 134 may be formed to extend through a base dielectric layer 136. Backside contact 134 may have any of the metal materials as described above for conductive contact 126. According to some embodiments, dielectric base layer 136 is formed after the removal of the substrate during backside processing. Dielectric base layer 136 may be any suitable dielectric material, such as silicon dioxide, aluminum oxide, or silicon oxycarbonitride. In some embodiments, a dielectric spacer 138 is present between a portion of backside contact 134 and base dielectric layer 136. Dielectric spacer 138 may be used to form a smaller opening when forming backside contact 134. In some embodiments, dielectric spacer 138 is the same material as base dielectric layer 136.

Due to the presence of metal fill 108, backside contact 134 can be formed as a shallower contact that touches a portion of the bottom surface of metal fill 108. This can greatly simplify the fabrication of such backside contacts while still maintaining a high conductivity between the metal contact and the epitaxial source or drain region.

Fabrication Methodology

FIGS. 2A-2K include cross-sectional views that collectively illustrate an example process for forming an integrated circuit configured with stacked semiconductor devices having a metal fill around at least some of the epitaxially formed source or drain regions. Each figure shows an example structure that results from the process flow up to that point in time, so the depicted structure evolves as the process flow continues, culminating in the structure shown in FIG. 2K, which is similar to the structure illustrated in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
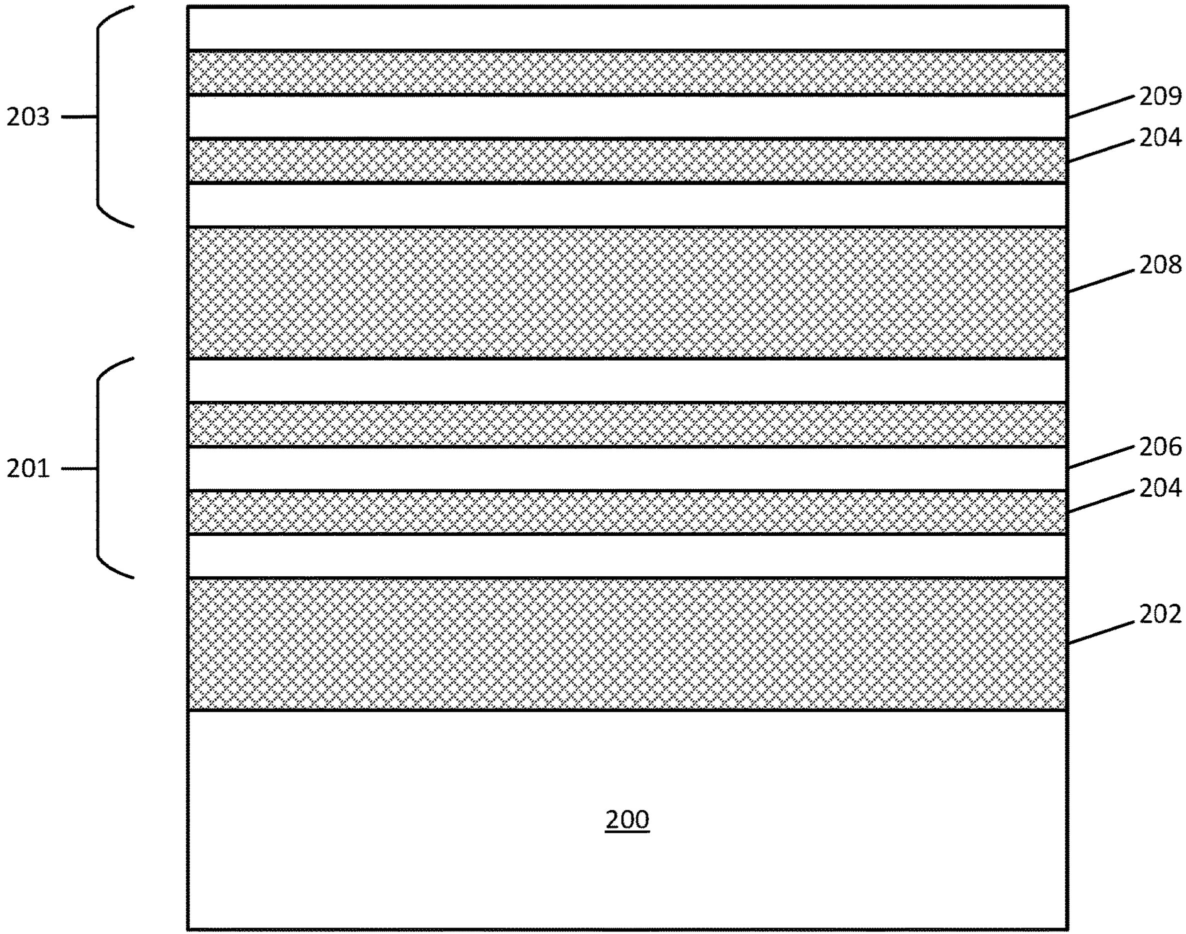
FIGS. 2A-2K are cross-sectional views that collectively illustrate an example process for forming a semiconductor device having a metalized source or drain region beneath a non-metalized source or drain region, in accordance with some embodiments of the present disclosure.

FIG. 2A illustrates a cross-sectional view across a substrate 200 having a series of material layers deposited over it, according to an embodiment of the present disclosure. Substrate 200 may be similar to substrate 102, as discussed above. Alternating material layers may be deposited over substrate 200, including a first layer stack 201, a second layer stack 203, a first spacer layer 202 between first layer stack 201 and substrate 200, and a second spacer layer 208 between first layer stack 201 and second layer stack 203. Each of first and second layer stacks 201 and 203 includes sacrificial layers 204 alternating with other material layers, such as first semiconductor layers 206 of first layer stack 201 and second semiconductor layers 209 of second layer stack 203. Any number of alternating sacrificial layers 204 and material layers may be deposited within each of first layer stack 201 and second layer stack 203. Additionally, any number of layer stacks and spacer layers may be deposited over substrate 200. It should be noted that the cross section illustrated in FIG. 2A is taken along the length of a fin formed from the multiple alternating layers and extending up above the surface of substrate 200.

According to some embodiments, sacrificial layers 204 have a different material composition than each of first semiconductor layers 206 and second semiconductor layers 209. In some embodiments, sacrificial layers 204 are silicon germanium (SiGe) while each of first semiconductor layers 206 and second semiconductor layers 209 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 204 and first and second semiconductor layers 206 and 209, the germanium concentration is different between sacrificial layers 204 and first and second semiconductor layers 206 and 209. For example, sacrificial layers 204 may include a higher germanium content compared to first and second semiconductor layers 206 and 209. Each of first and second spacer layers 202 and 208 may include the same material as sacrificial layers 204. In some examples, spacer layers 202/208 can be any material that exhibits a high etch selectivity with the material of semiconductor layers 206 and 209.

While dimensions can vary from one example embodiment to the next, the thickness of each sacrificial layer 204 may be between about 5 nm and about 20 nm. In some embodiments, the thickness of each sacrificial layer 204 is substantially the same (e.g., within 1-2 nm) across each of first layer stack 201 and second layer stack 203. The thickness of each of first semiconductor layers 206 and second semiconductor layers 209 may be about the same as the thickness of each sacrificial layer 204 (e.g., about 5-20 nm). However, according to some embodiments, the thickness of first and second spacer layers 202/208 is thicker than any of sacrificial layers 204. First spacer layer 202 is provided to create a sufficient spacing between a bottom semiconductor device and substrate 200 while second spacer layer 208 is provided to create a sufficient spacing between the adjacent semiconductor devices to be formed from first semiconductor layers 206 and second semiconductor layers 209. While dimensions can vary from one example embodiment to the next, the thickness of first and second spacer layers 202/208 may be between about 10 nm to about 80 nm. Each of sacrificial layers 204, first semiconductor layers 206, second semiconductor layers 209, first spacer layer 202, and second spacer layer 208 may be deposited using any known material deposition technique, such as chemical vapor deposition (CVD), plasma-enhanced chemical vapor deposition (PECVD), physical vapor deposition (PVD), or atomic layer deposition (ALD).

First semiconductor layers 206 may be doped with either n-type dopants (to produce a p-channel transistor) or p-type dopants (to produce an n-channel transistor). Similarly, second semiconductor layers 209 may be doped with either n-type dopants (to produce a p-channel transistor) or p-type dopants (to produce an n-channel transistor).

Figure 2B:
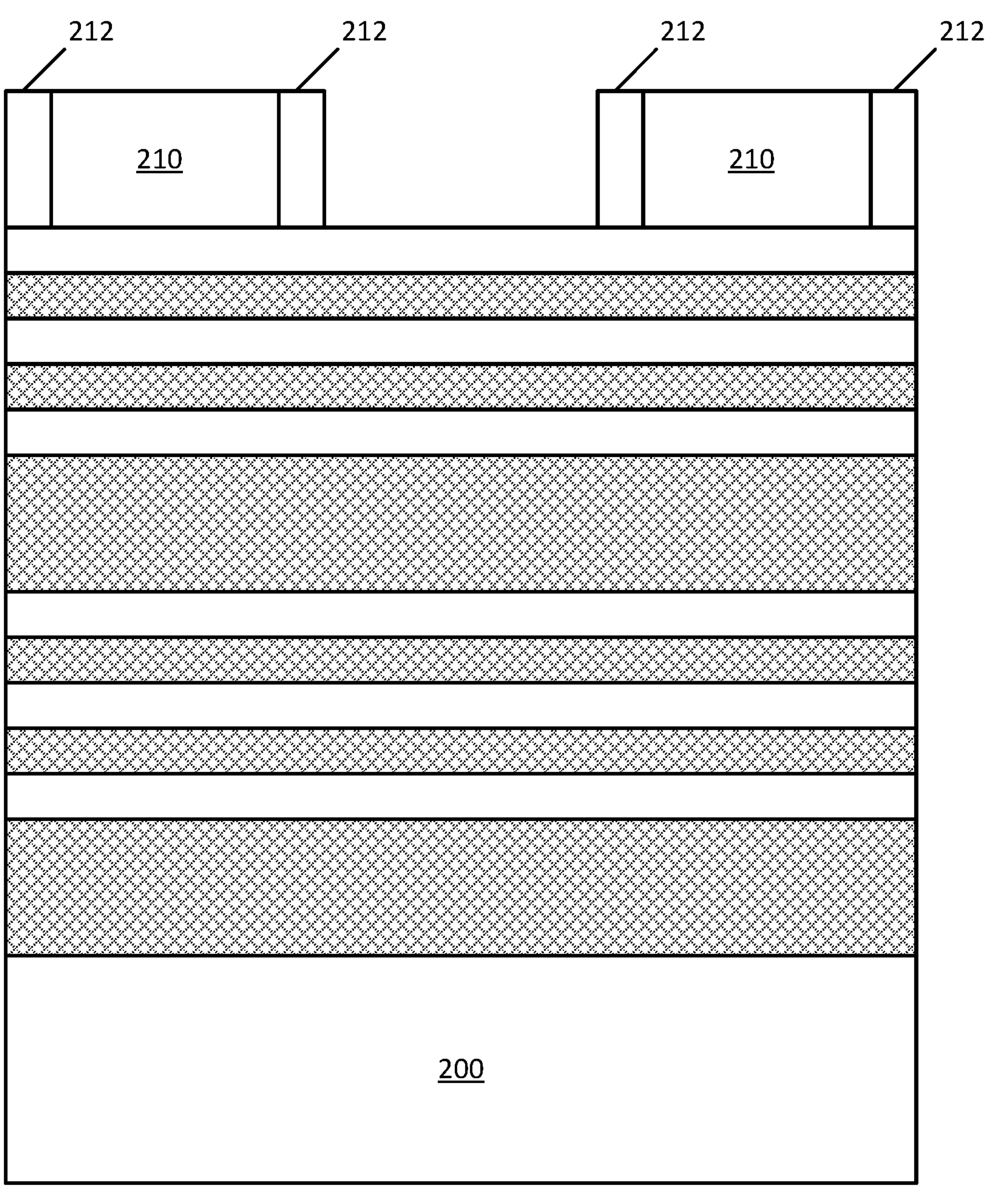

FIG. 2B illustrates a cross-sectional view of the structure shown in FIG. 2A following the formation of a sacrificial gate structures 210 and sidewall spacers 212 over the alternating layer structure of the fin, according to an embodiment. Sacrificial gate structures 210 may run in an orthogonal direction to the length of the fin and may include any material that can be safely removed later in the process without etching or otherwise damaging any portions of the fin or of spacer structures 212. In some embodiments, sacrificial gate structures 210 include polysilicon. Spacer structures 212 may be formed using an etch-back process where spacer material is deposited everywhere and then anisotropically etched to leave the material only on sidewalls of structures including sacrificial gate structures 210. Spacer structures 212 may include a dielectric material, such as silicon nitride, silicon oxynitride, or any formulation of those layers incorporating carbon or boron dopants. Each sacrificial gate structure 210 together with its associated spacer structures 212 define a portion of the fin that will be used to form a stack of transistor devices as discussed further herein.

Figure 2C:
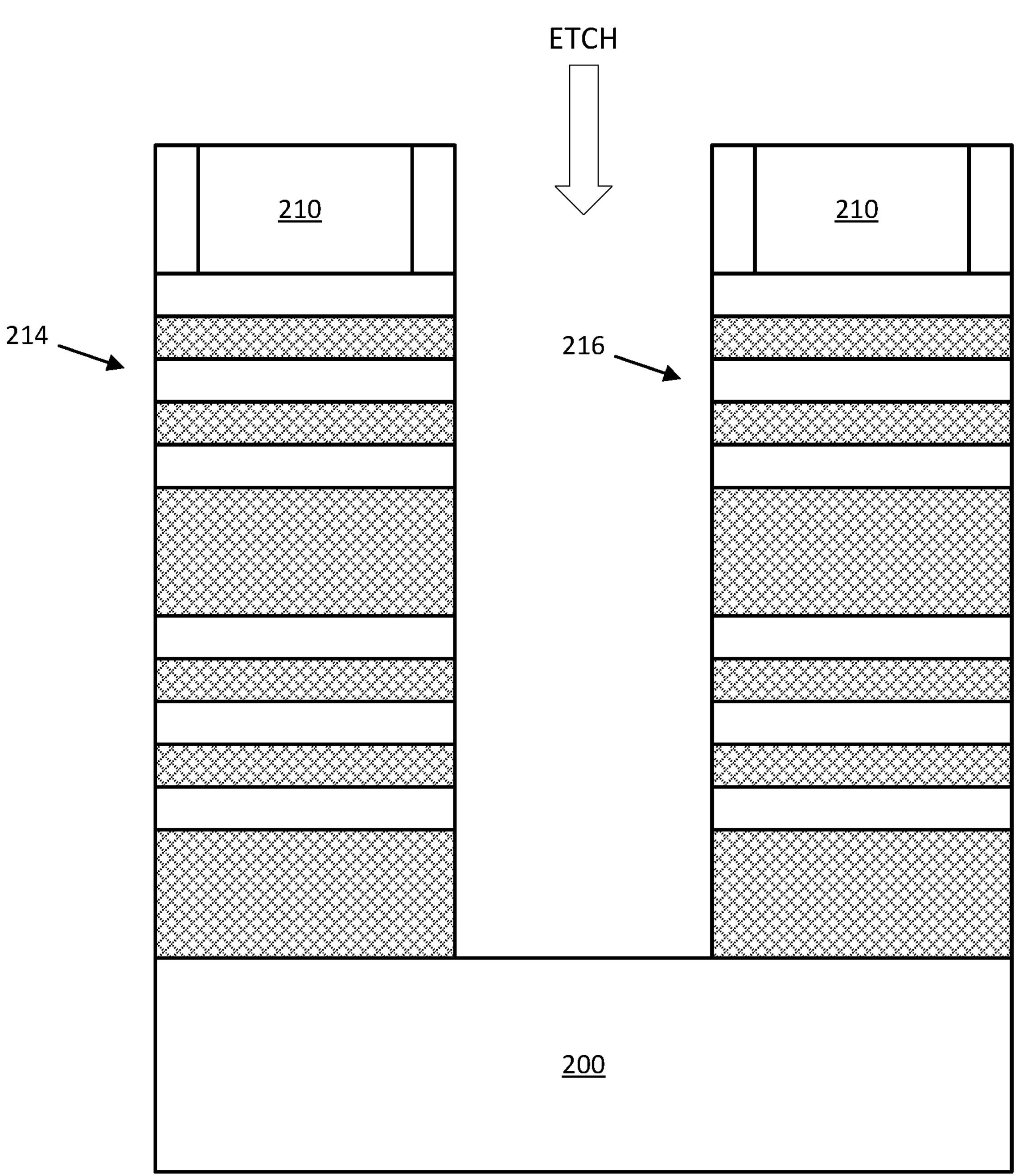

FIG. 2C illustrates a cross-sectional view of the structure shown in FIG. 2B following the removal of the exposed fin not under sacrificial gate structures 210 and sidewall spacers 212, according to an embodiment of the present disclosure. According to some embodiments, the various layers of the different layer stacks are etched at substantially the same rate using an anisotropic RIE process. As observed in FIG. 2C, the width of spacer structures 212 works to define the length of the resulting fins 214 and 216. In some embodiments, some undercutting occurs along the edges of the fins beneath spacer structures 212 such that the lengths of the fins are not exactly the same as a sum of the widths of spacer structures 212 and a width of a given sacrificial gate structure 210. Similar to the discussion related to FIGS. 1A-1C, the discussion of the fabrication process herein will focus on fin 214 though the same processes may be occurring with fin 216.

Figure 2D:
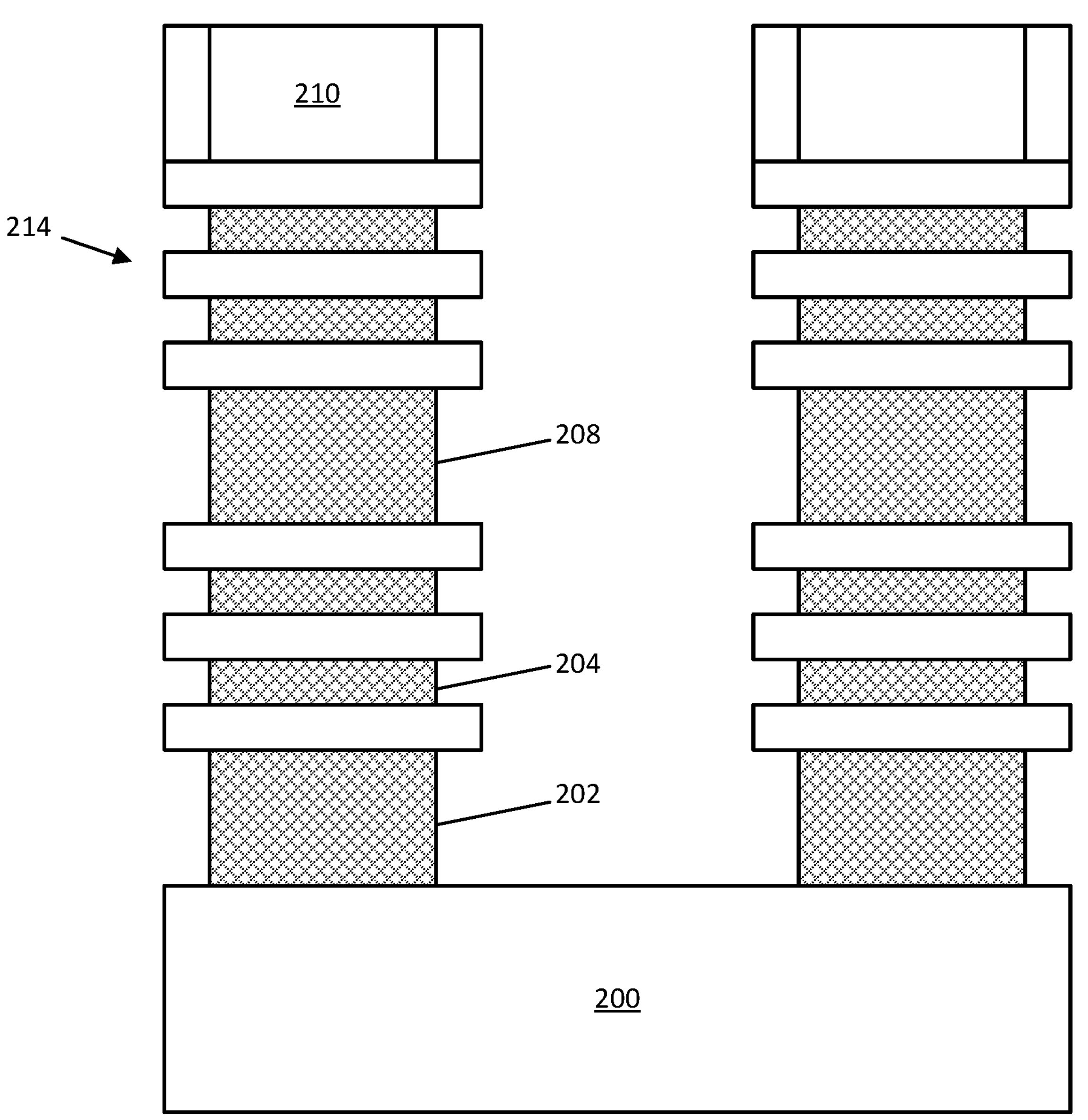

FIG. 2D illustrates a cross-sectional view of the structure shown in FIG. 2C following the removal of portions of sacrificial layers 204, according to an embodiment of the present disclosure. An isotropic etching process may be used to recess the exposed ends of each sacrificial layer 204 along the entire layer stack of fin 214. First and second spacer layers 202 and 208 may be recessed as well along with each sacrificial layer 204. The isotropic etchant used exhibits a high etch selectivity between sacrificial layers 204 and each of the semiconductor layers.

Figure 2E:
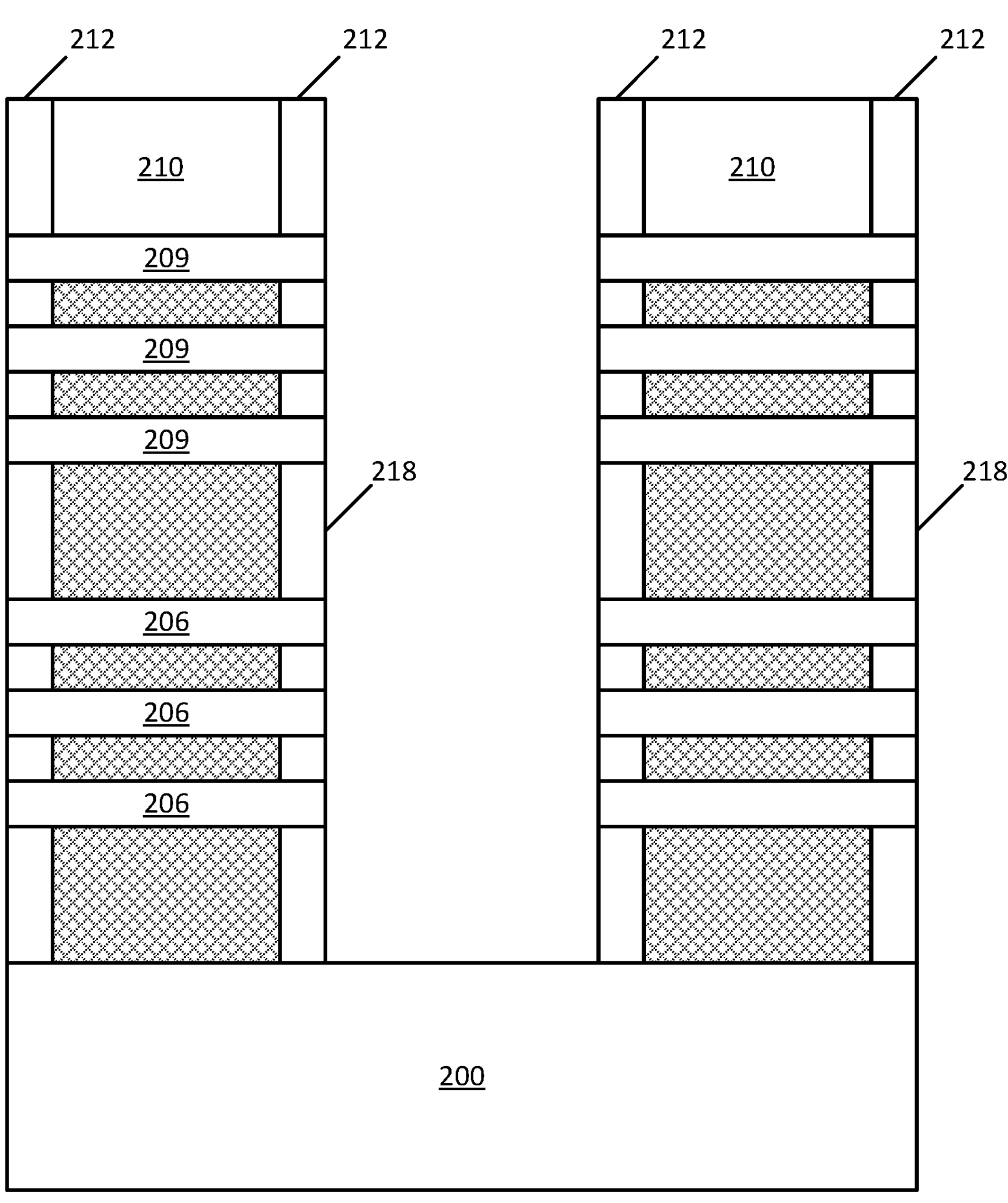

FIG. 2E illustrates a cross-sectional view of the structure shown in FIG. 2D following the formation of internal spacers 218, according to an embodiment of the present disclosure. Internal spacers 218 may have a material composition that is similar to or the exact same as spacer structures 212. Accordingly, internal spacers 218 may be any suitable dielectric material that exhibits high etch selectively to semiconductor materials such as silicon and/or silicon germanium. Internal spacers 218 may be conformally deposited over the sides of the fin structure using a CVD process like ALD. After the dielectric material has been deposited, an isotropic etching process is performed to remove internal spacers 218 from the tips of the semiconductor layers 206 and 209. According to some embodiments, internal spacers 218 are recessed inwards at least until the ends of both first semiconductor layers 206 and second semiconductor layers 209 are exposed.

Figure 2F:
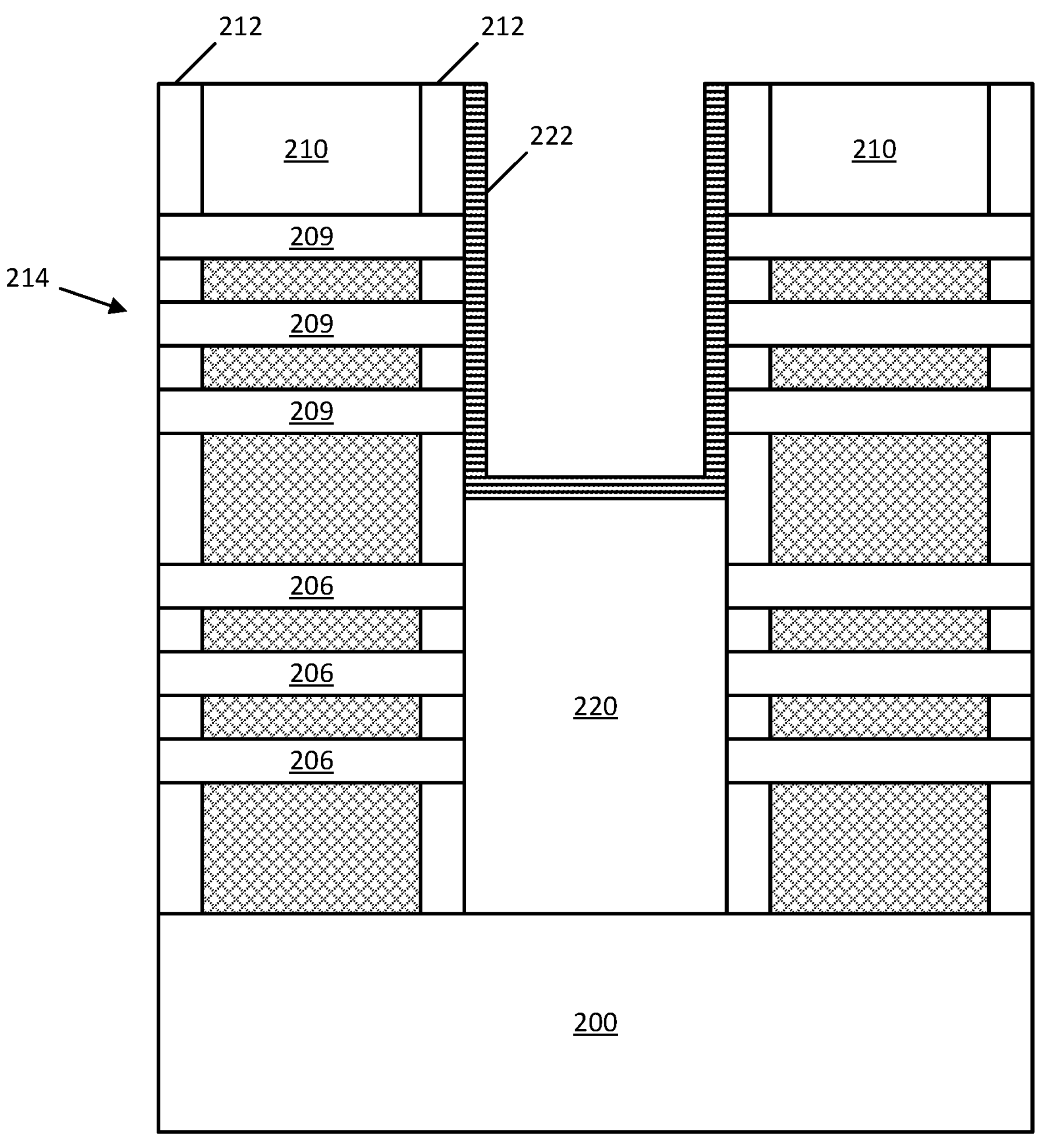

FIG. 2F illustrates a cross-sectional view of the structure shown in FIG. 2E following the formation of various structures within a trench alongside fin 214, according to some embodiments. For example, a masking material 220 may be first formed within the trench and along each of first semiconductor layers 206. Accordingly, masking material 220 may have a thickness such that a top surface of masking material 220 is above at least a top surface of the top-most semiconductor layer 206. Masking material 220 may be a carbon hard mask (CHM) or any other suitable photoresist or dielectric material that can be selectively removed at a later time.

Following the formation of masking material 220, a liner 222 is formed over the sides of each of second semiconductor layers 209, according to an embodiment. Liner 222 may also be formed on a top surface of masking material 220. Liner 222 may be conformally deposited using a CVD technique, such as ALD. According to some embodiments, liner 222 includes a dielectric material that is different from the material of masking material 220 such that there is a high etch selectivity between liner 222 and masking material 220. Liner 222 may have a thickness between about 1 nm and about 4 nm.

Figure 2G:
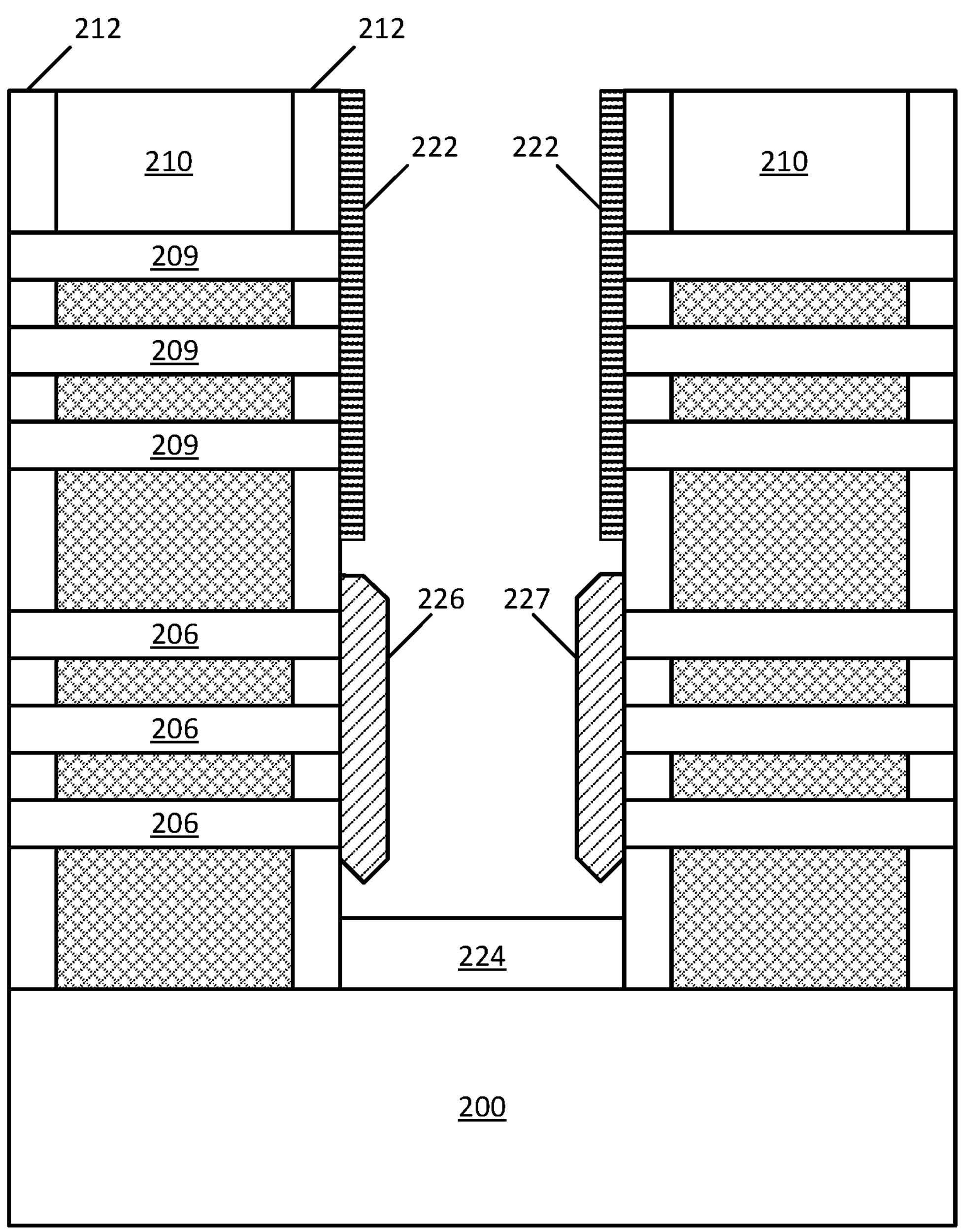

FIG. 2G illustrates a cross-sectional view of the structure shown in FIG. 2F following the removal of masking material 220 and formation of epitaxial source or drain regions 226 and 227, according to an embodiment. An anisotropic etching process may first be performed to punch through the portion of liner 222 on the top surface of masking material 220. Once masking material 220 has been exposed, an isotropic etch process (such as an ashing process) may be performed to selectively remove masking material 220 while liner 222 is maintained over each of second semiconductor layers 209. In some embodiments, a bottom dielectric layer 224 is formed to provide additional isolation from substrate 200. Bottom dielectric layer 224 may be any suitable dielectric material, such as silicon nitride, silicon oxide, silicon carbide, silicon oxynitride, or silicon oxynitrocarbide.

According to some embodiments, a first source or drain region 226 may be grown directly from the exposed ends of first semiconductor layers 206. Accordingly, in some embodiments, first source or drain region 226 represents nubs or islands of epitaxial growth on the ends of first semiconductor layers 206, where at least some of the nubs or islands are not merged together. In other embodiments, such as the one illustrated, first source or drain region 226 represents merged epitaxial growths from the ends of first semiconductor layers 206. As noted above, first semiconductor layers 206 extend between first source or drain region 226 and a second source or drain region that would be present on the left side of first semiconductor layers 206. In the example of a PMOS device, first source or drain region 226 may be a semiconductor material (e.g., group IV and group III-V semiconductor materials) having a higher dopant concentration of p-type dopants compared to n-type dopants.

Figure 2H:
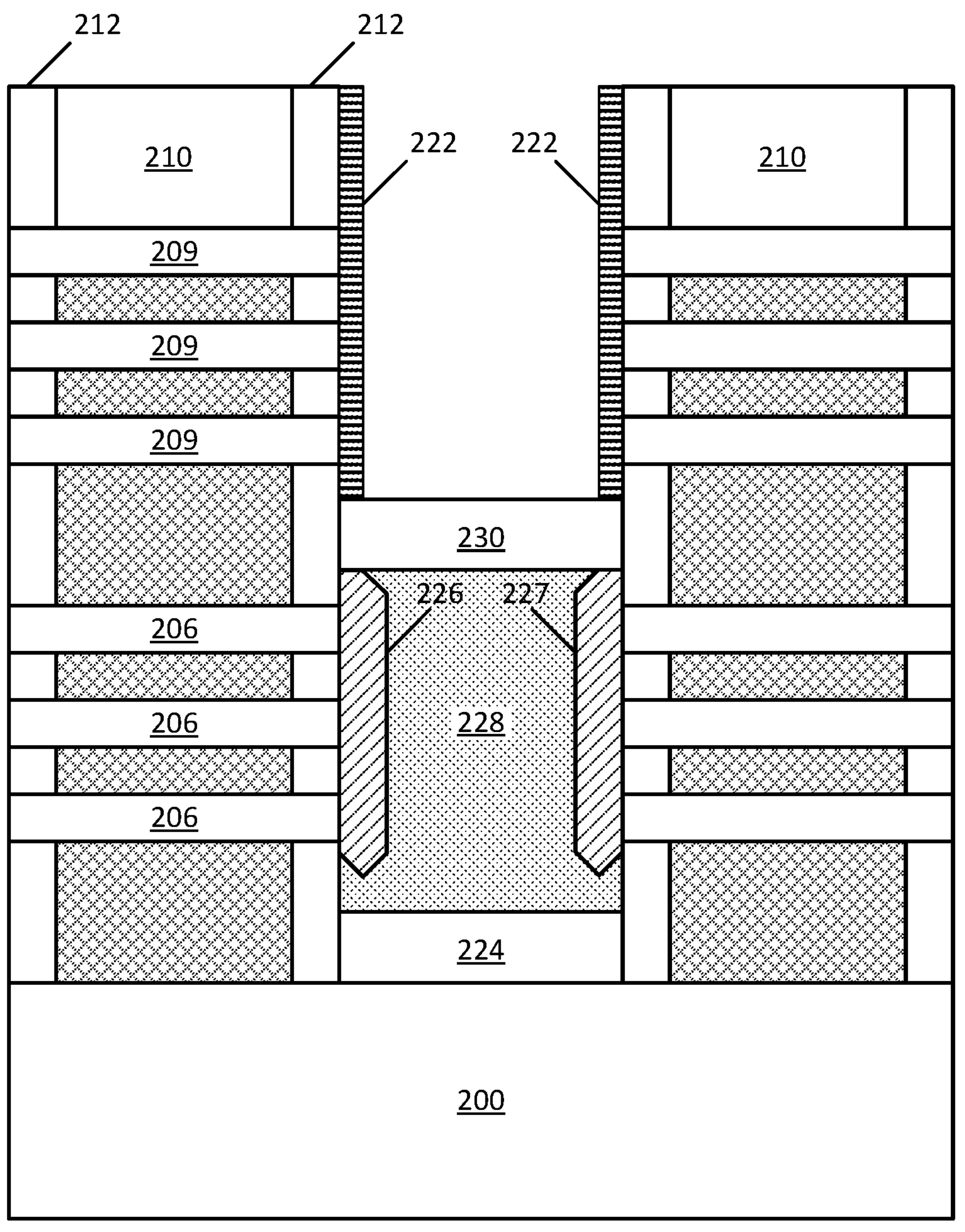

FIG. 2H illustrates a cross-sectional view of the structure shown in FIG. 2G following the formation of a metal fill 228 around at least first source or drain region 226, according to an embodiment. In an example where first source or drain region 226 represents individual epitaxial nubs, metal fill 228 may surround each nub such that it is present between the nubs of first source or drain region 226. According to some embodiments, metal fill 228 includes a continuous body of refractory metal, such as ruthenium (Ru), tungsten (W), cobalt (Co), or molybdenum (Mo). Such refractory metals do not react with the adjacent source or drain material, and thus no silicide or germanide forms at the boundary between metal fill 228 and the epitaxial material of first source or drain region 226. According to some embodiments, the refractory metal of metal fill 228 directly contacts the epitaxial material of first source or drain region 226.

In some embodiments, metal fill 228 includes any suitable non-reactive metal or metal compound. For example, some metal silicides like MoSi or TaSi can be reacted together in a gaseous state and deposited as metal fill 228. Since the compounds have already reacted, no further reaction takes place with the epi material of the source or drain regions. Accordingly, metal fill 228 may include a consistent material composition of either a single refractory metal or non-reactive metal compound throughout the body of the metal fill 228 with no material gradient present at the interface between metal fill 228 and the epi material of first source or drain region 226.

According to some embodiments, metal fill 228 may be formed via a combination of PVD and CVD processes. For example, a PVD process may be used first to deposit a layer of metal material over first source or drain region 226 followed by depositing the same metal material using a CVD process to complete the formation of metal fill 228. In some embodiments, no seam will be present between the metal material depositing using the different deposition processes (e.g., metal fill 228 will appear to be a continuous body of conductive material). In some other embodiments, based on the deposition method and/or parameters, a seam may be visible between the metal deposited using PVD and the metal deposited using CVD.

Figure 2I:
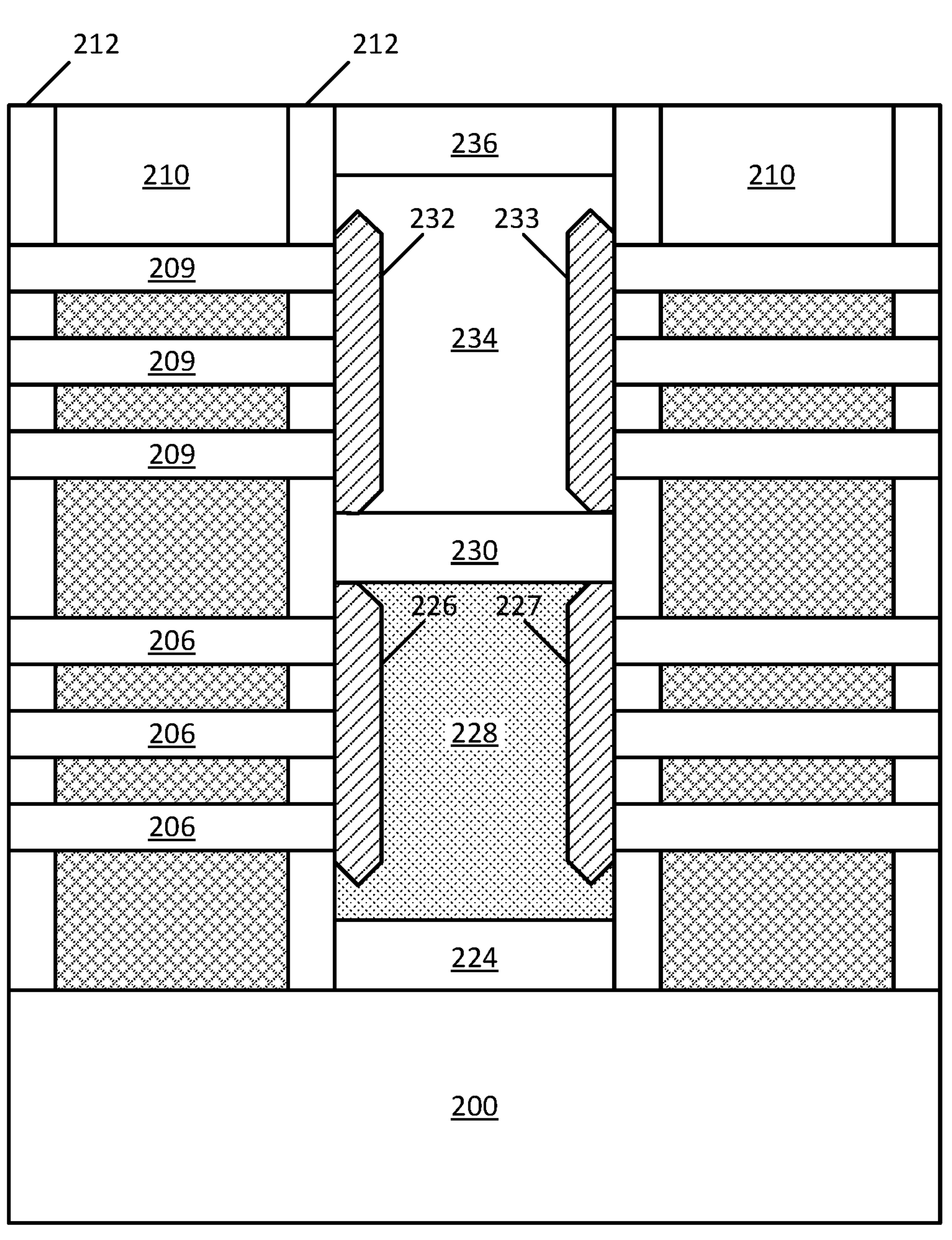

FIG. 2I illustrates a cross-sectional view of the structure shown in FIG. 2H following the formation of a third source or drain region above metal fill 228, according to an embodiment. Liner 222 may be removed and a insulator layer 230 may be formed in any order. Insulator layer 230 may be any suitable dielectric material, such as silicon nitride, silicon oxide, silicon carbide, silicon oxynitride, or silicon oxynitrocarbide. In some embodiments insulator layer 230 is a titanium-based dielectric. Insulator layer 230 may have a thickness between about 10 nm and about 30 nm. In some embodiments, insulator layer 230 is omitted due to the presence of metal fill 228 surrounding the lower first source or drain region 226.

As noted above, first semiconductor layers 206 extend between first source or drain region 226 and a second source or drain region that would be present on the left side of first semiconductor layers 206. A third source or drain region may be formed adjacent to the ends of second semiconductor layers 209, such that second semiconductor layers 209 extend between the third source or drain region and a fourth source or drain region that would be present on the left side of second semiconductor layers 209. The third source or drain region may include first epitaxial portions 232 and 233 and a second epitaxial portion 234 over the first epitaxial portions. The first epitaxial portion 232 may be grown directly from the exposed ends of second semiconductor layers 209. Accordingly, in some embodiments, first epitaxial portion 232 represents nubs or islands of epitaxial growth on the ends of second semiconductor layers 209, where at least some of the nubs or islands are not merged together. In other embodiments, such as the one illustrated, first epitaxial portion 232 represents merged epitaxial growths from the ends of second semiconductor layers 209. According to some embodiments, second epitaxial portion 234 is formed over first epitaxial portions 232 and 233 and has a higher dopant concentration compared to first epitaxial portions 232 and 233. In the example of an NMOS device, first epitaxial portions 232 and 233 may be a semiconductor material (e.g., group IV and group III-V semiconductor materials) having a first dopant concentration of n-type dopants while second epitaxial portion 234 is a semiconductor material (e.g., group IV and group III-V semiconductor materials) having a second dopant concentration of n-type dopants that is higher than the first dopant concentration.

According to some embodiments, a top dielectric layer 236 may be formed over the third source or drain region (made up of first epitaxial portions 232/233 and second epitaxial portion 234). In some embodiments, a top surface of top dielectric layer 236 is planarized to be substantially level with a top surface of sacrificial gate structure 210. Polishing of the top surface of top dielectric layer 236 may be performed using chemical mechanical polishing (CMP).

Figure 2J:
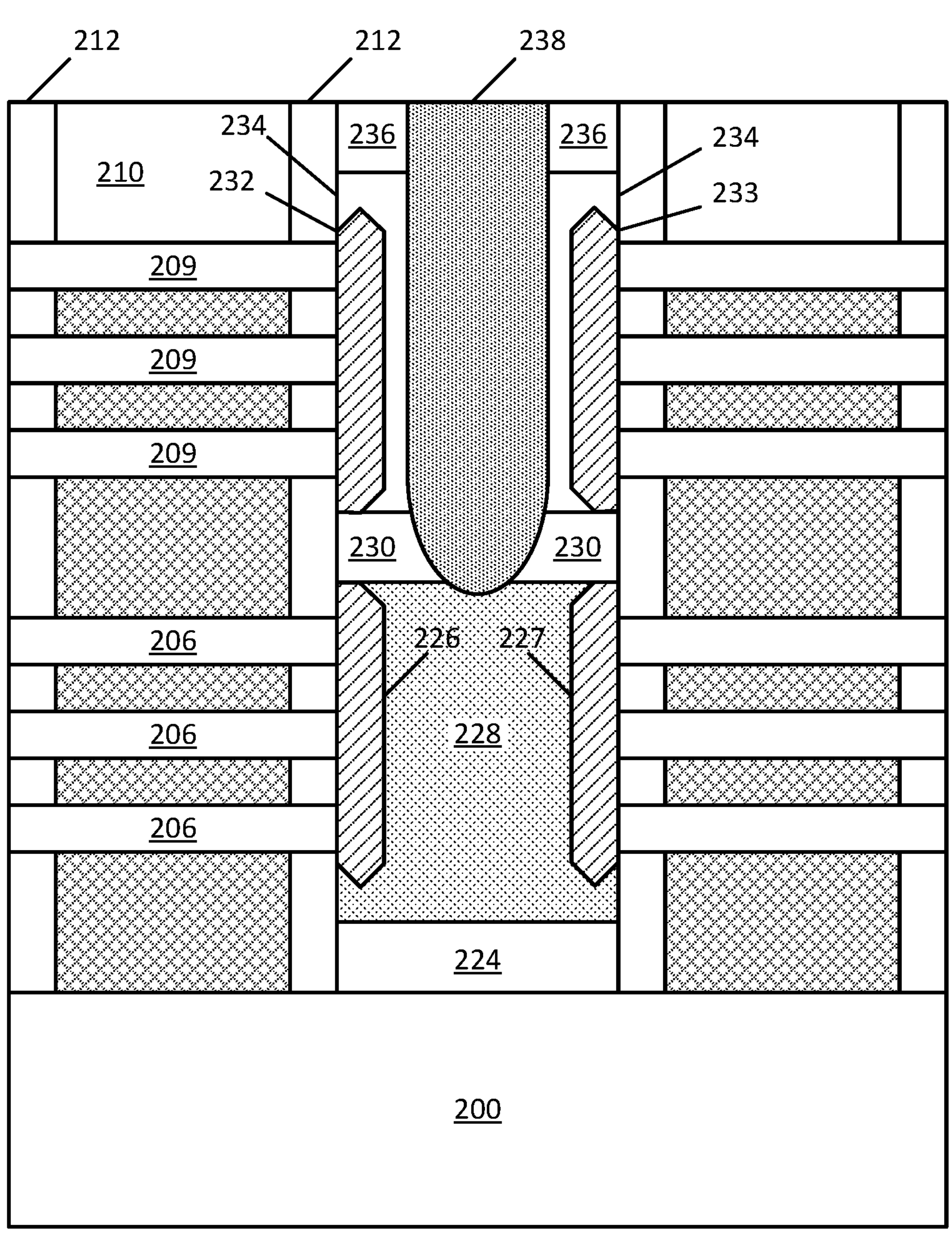

FIG. 2J illustrates a cross-sectional view of the structure shown in FIG. 2I following the formation of a conductive contact 238, according to an embodiment of the present disclosure. An anisotropic etching process, such as RIE, may be used to etch a recess through top dielectric layer 236 and through a thickness of the third source or drain region. In some embodiments, the etched recess extends through an entire thickness of the third source or drain region and through an entire thickness of insulator layer 230. The recess may extend into a portion of metal fill 228, in some examples. According to some embodiments, the recess is aligned such that it does not expose any portion of the first epitaxial portions 232/233 of the third source or drain region. Thus, the recess may be formed only through second epitaxial portion 234 of the third source or drain region.

According to some embodiments, the etched recess is filled with a conductive material to form conductive contact 238. Due to the narrow etch profile, conductive contact 238 may have a tapered end. Conductive contact 238 may include any conductive material such as copper (Cu), ruthenium (Ru), tungsten (W), cobalt (Co), titanium (Ti), molybdenum (Mo), or any alloys thereof. In some embodiments, conductive contact 238 includes layers of different conductive materials, such as a liner that includes titanium silicide or nitrogen silicide and a fill material that includes tungsten or cobalt, to name a few examples. According to some embodiments, conductive contact 238 includes a continuous body of refractory metal, such as ruthenium (Ru), tungsten (W), cobalt (Co), or molybdenum (Mo). Such refractory metals do not react with the adjacent material of third source or drain region, and thus no silicide or germanide forms at the boundary between conductive contact 238 and the epitaxial material of second epitaxial portion 234 of the third source or drain region. The refractory metal used in conductive contact 238 may be the same refractory metal used in metal fill 228. Accordingly, in some embodiments, no seam will be present between conductive contact 238 and metal fill 228 while in other embodiments, a seam may be visible between the two metal structures due to different metal materials and/or deposition processes.

According to some embodiments where first epitaxial portions 232/233 represent individual nubs or islands of epitaxial growth from the ends of the semiconductor layers, conductive contact 238 does not contact at least one of the epitaxial nubs or islands of first epitaxial portions 232/233. In some examples, conductive contact 238 does not contact any of the epitaxial nubs or islands of first epitaxial portions 232/233. Depending on the depth of the etched recess, conductive contact 238 may extend through an entire thickness of the third source or drain region and through an entire thickness of insulator layer 230 to contact a top surface of metal fill 228, as illustrated. A top surface of conductive contact 238 may be polished using, for example, CMP to planarize the top surface along with the top surface of sacrificial gate structure 210.

Figure 2K:
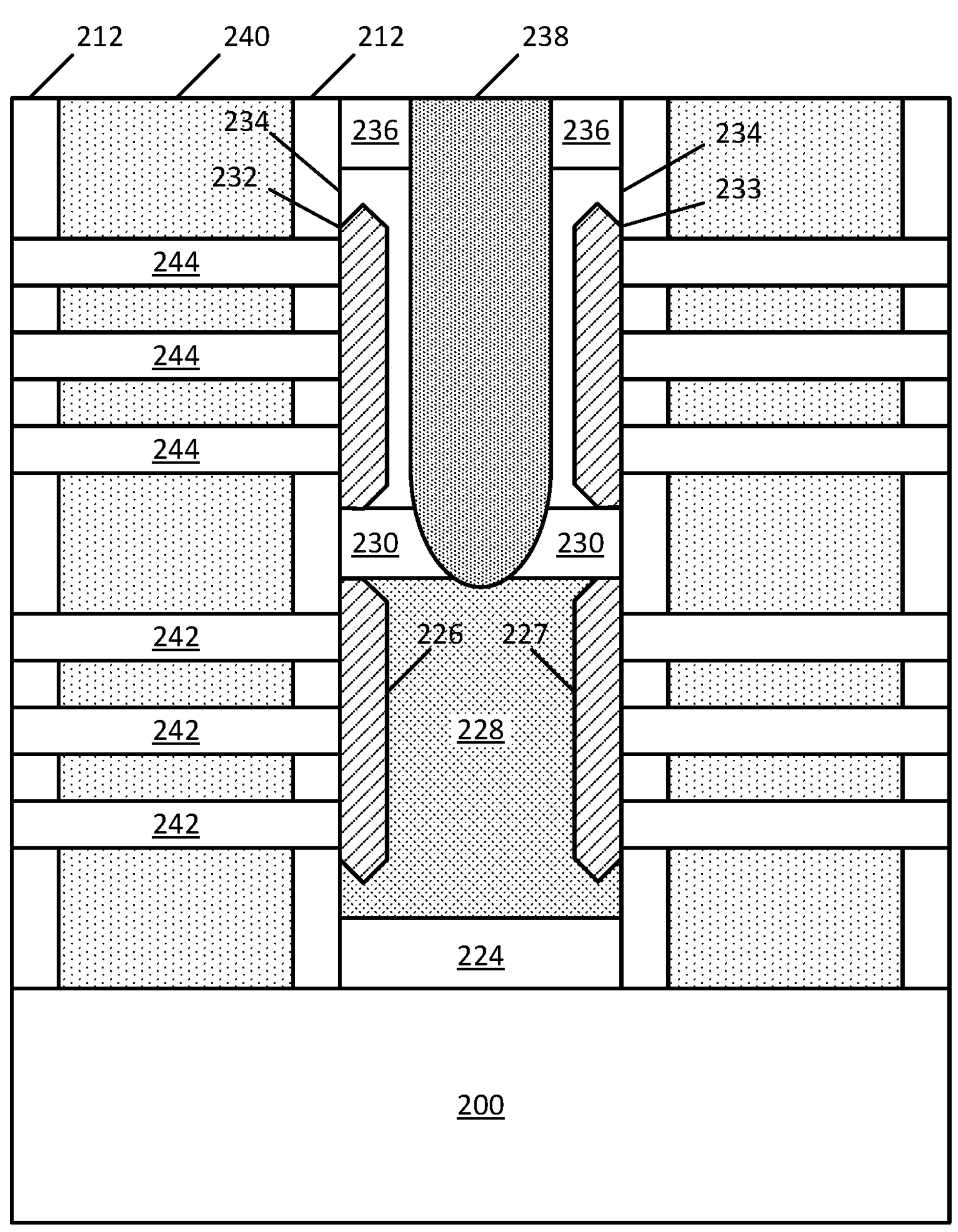

FIG. 2K illustrates a cross-sectional view of the structure shown in FIG. 2J following the removal of the sacrificial gate structure 210 and sacrificial layers 204 and the formation of a gate structure 240, according to an embodiment of the present disclosure. Sacrificial gate structure 210 may be removed using any wet or dry isotropic process thus exposing the alternating layer stack of the fin within the trench left behind after the removal of sacrificial gate structure 210. Once sacrificial gate structure 210 has been removed, sacrificial layers 204 (along with spacer layers 202 and 208) may also be removed using a selective isotropic etching process that removes the material of sacrificial layers 204 (along with spacer layers 202 and 208) but does not remove (or removes very little of) first semiconductor layers 206 and second semiconductor layers 209. At this point, the suspended (sometimes called released) first semiconductor layers 206 form first nanoribbons 242 that extend between first source or drain region 226 and the second source or drain region, and the suspended second semiconductor layers 209 form second nanoribbons 244 that extend between the third source or drain region (made up of first epitaxial portions 232/233 and second epitaxial portion 234) and the fourth source or drain region.

As noted above, gate structure 240 includes a gate dielectric and a gate electrode. The gate dielectric may be conformally deposited around first nanoribbons 242 and second nanoribbons 244 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on first and second nanoribbons 242/244, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Recall the workfunction layers formed around first nanoribbons 242 can be different from the workfunction layers formed around second nanoribbons 244, according to some example embodiments.

Figure 3A:
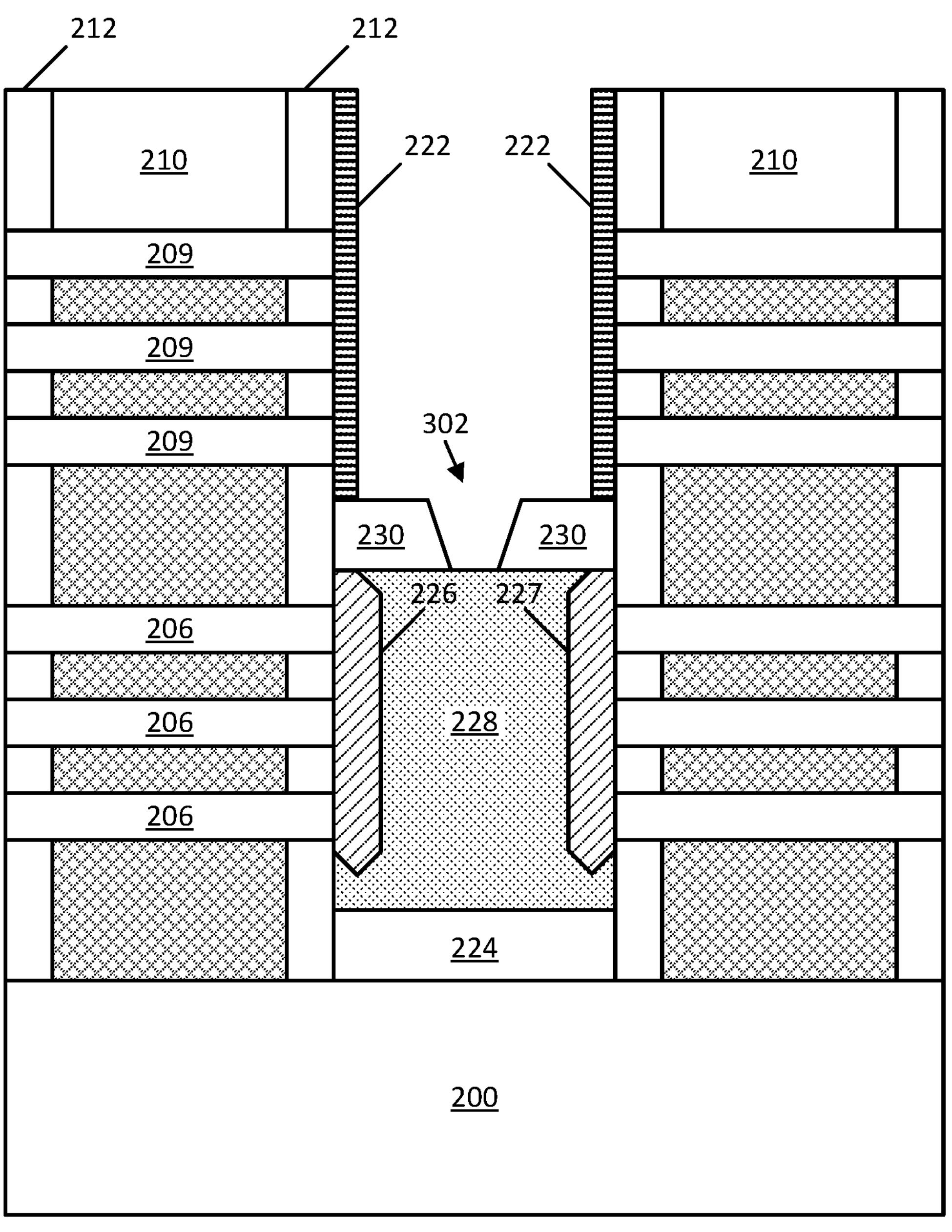
FIGS. 3A-3C are cross-sectional views that collectively illustrate an example process for forming a semiconductor device having a metalized source or drain region beneath another metalized source or drain region, in accordance with some embodiments of the present disclosure.
Figure 3B:
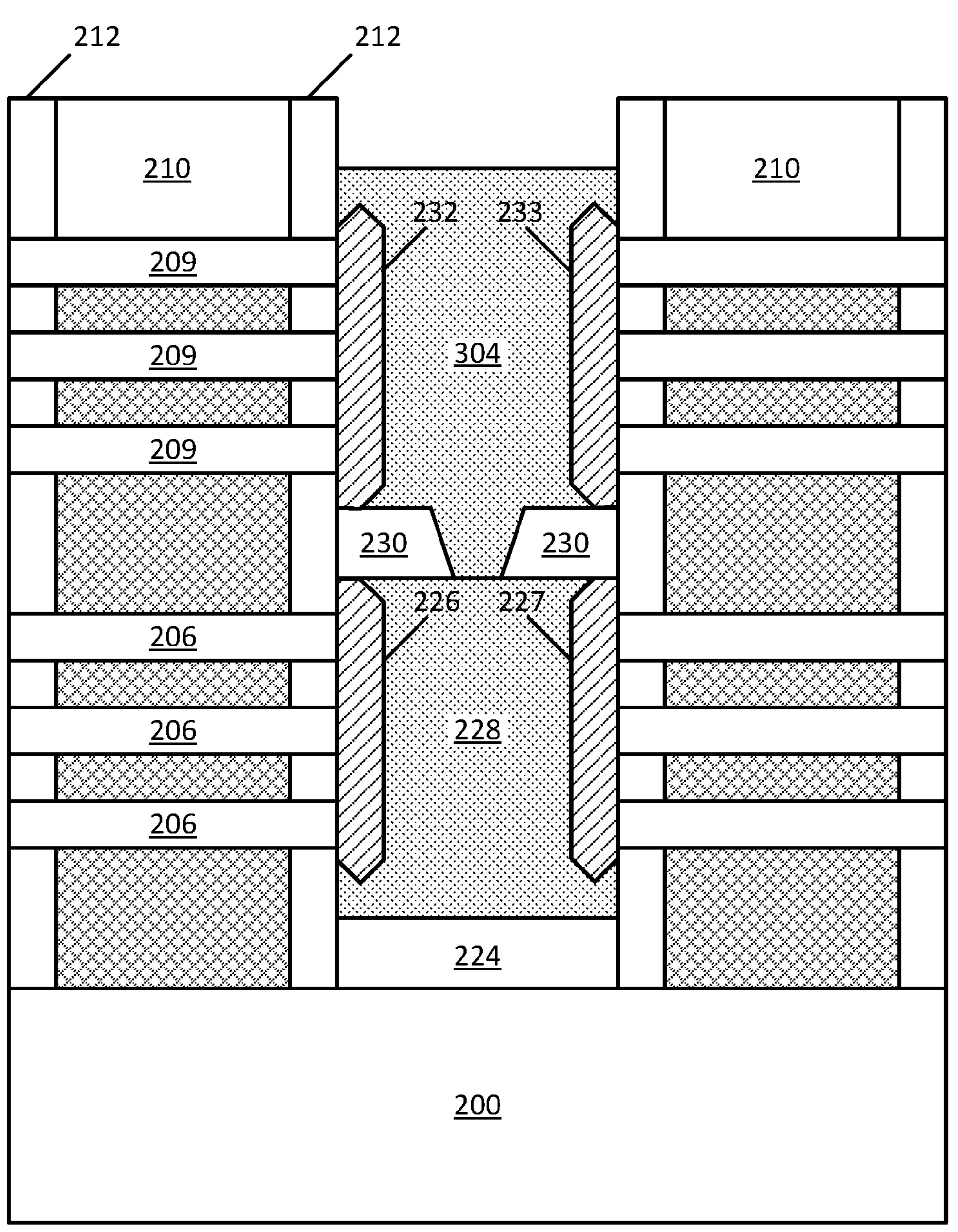
Figure 3C:
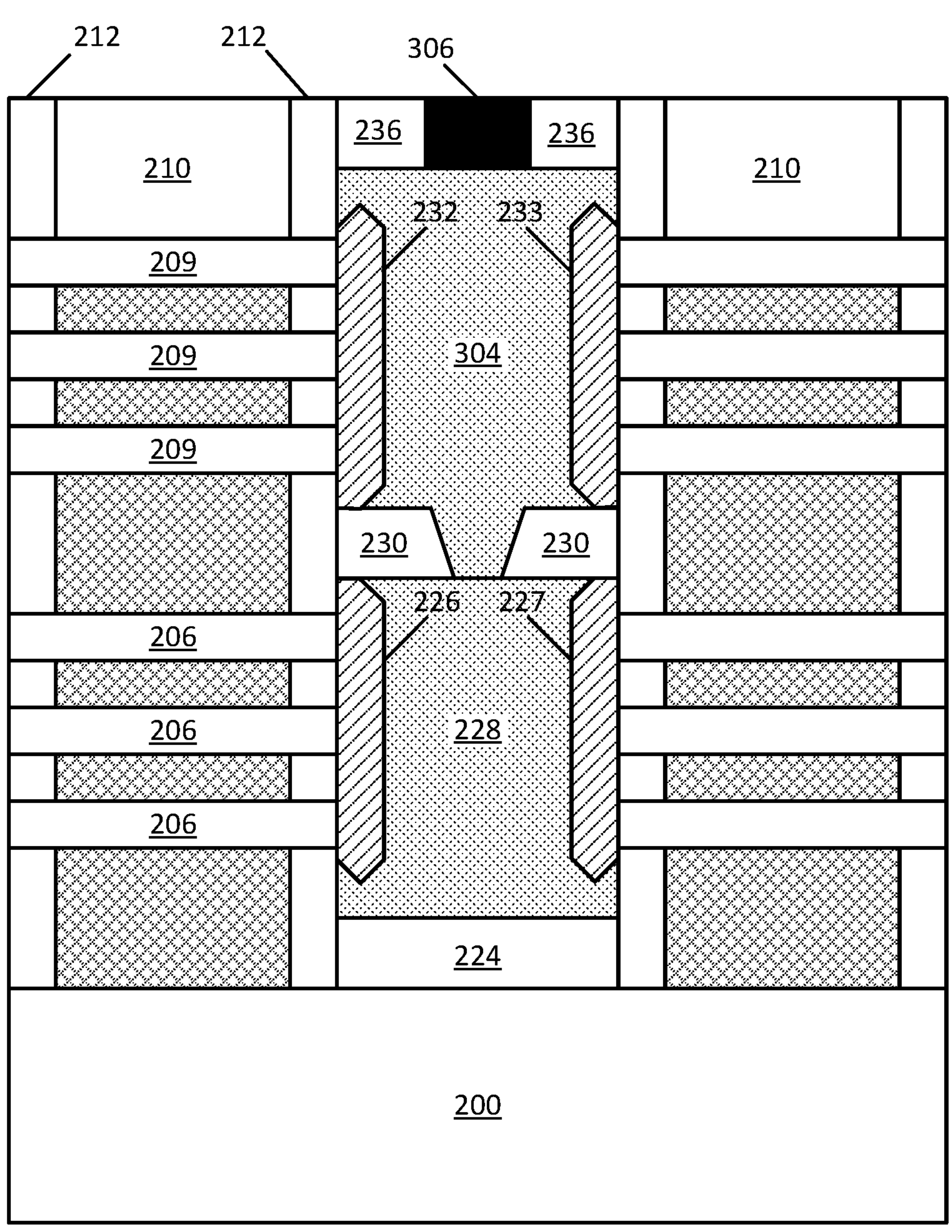

FIGS. 3A-3C include cross-sectional views that collectively illustrate an example process that takes over from the structure shown in FIG. 2H and results in metal fill being used around both of the stacked source or drain regions. Each figure shows an example structure that results from the process flow up to that point in time, so the depicted structure evolves as the process flow continues, culminating in the structure shown in FIG. 3C, which is similar to the structure illustrated in FIG. 1B. Example materials and process parameters are given, but the present disclosure is not intended to be limited to any specific such materials or parameters, as will be appreciated.

FIG. 3A illustrates a cross-sectional view of the structure shown in FIG. 2H following the formation of a recess 302 through insulator layer 230, according to an embodiment. Recess 302 may be formed through an entire thickness of insulator layer 230 using any dry anisotropic etching process. In some embodiments, all of insulator layer 230 is removed using an isotropic etching process.

FIG. 3B illustrates a cross-sectional view of the structure shown in FIG. 3A following the formation of epitaxial portions 232 and 233 and second metal fill 304, according to an embodiment. Epitaxial portion 232 may first be formed from the ends of second semiconductor layers 209, as discussed above. In this example, epitaxial portion 232 represents the third source or drain region in the absence of a second epitaxial portion over epitaxial portion 232.

According to some embodiments, second metal fill 304 contacts at least a portion of a top surface of metal fill 228. In an example where epitaxial portion 232 represents individual epitaxial nubs, second metal fill 304 may surround each nub such that it is present between the nubs of the epitaxial portion 232. According to some embodiments, second metal fill 304 includes a continuous body of refractory metal, such as ruthenium (Ru), tungsten (W), cobalt (Co), or molybdenum (Mo). Such refractory metals do not react with the adjacent source or drain material, and thus no silicide or germanide forms at the boundary between second metal fill 304 and the semiconductor material of epitaxial portions 232 or 233. According to some embodiments, the refractory metal of second metal fill 304 directly contacts the semiconductor material of epitaxial portion 232 and the metal material of metal fill 228.

In some embodiments, second metal fill 304 is formed in the same way as metal fill 228. Second metal fill 304 may include the same metal material as metal fill 228. Accordingly, there may be no visible seam at the boundary between second metal fill 304 and metal fill 228. In some other examples, a seam is visible between second metal fill 304 and metal fill 228 depending on the deposition techniques and parameters used for both metal fill structures.

FIG. 3C illustrates a cross-sectional view of the structure shown in FIG. 3B following the formation of top dielectric layer 236 and a conductive via 306, according to an embodiment. Conductive via 306 may be formed through a thickness of top dielectric layer 236 to contact a top surface of second metal fill 304. Due to the formation of both metal fill 228 and second metal fill 304, electrical connection may be made between via 306 and both first source or drain region 226 and the third source or drain region (e.g., epitaxial portion 232). Conductive via 306 may be any suitably conductive material. Since conductive via 306 does not need to contact any semiconductor material, many different types of metals or other conductive materials can be used. Furthermore, the use of second metal fill 304 has effectively replaced the deep contact structure extending through the source or drain region (e.g., conductive contact 238), thus simplifying the fabrication process. Once the contact structures have been completed, sacrificial gate structure 210 and sacrificial layers 204 may be removed to form a gate structure around each of the suspended semiconductor nanoribbons as discussed above in FIG. 2K.

Figure 4:
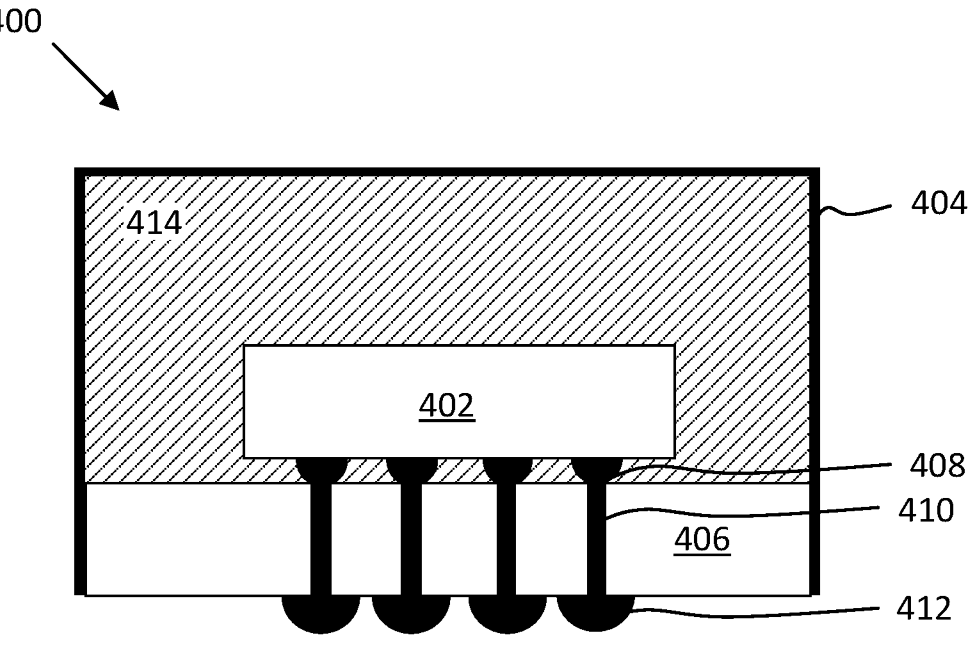
FIG. 4 illustrates a cross-section view of a chip package containing one or more semiconductor dies, in accordance with some embodiments of the present disclosure.

FIG. 4 illustrates an example embodiment of a chip package 400, in accordance with an embodiment of the present disclosure. As can be seen, chip package 400 includes one or more dies 402. One or more dies 402 may include at least one integrated circuit having semiconductor devices, such as any of the semiconductor devices disclosed herein. One or more dies 402 may include any other circuitry used to interface with other devices formed on the dies, or other devices connected to chip package 400, in some example configurations.

As can be further seen, chip package 400 includes a housing 404 that is bonded to a package substrate 406. The housing 404 may be any standard or proprietary housing, and may provide, for example, electromagnetic shielding and environmental protection for the components of chip package 400. The one or more dies 402 may be conductively coupled to a package substrate 406 using connections 408, which may be implemented with any number of standard or proprietary connection mechanisms, such as solder bumps, ball grid array (BGA), pins, or wire bonds, to name a few examples. Package substrate 406 may be any standard or proprietary package substrate, but in some cases includes a dielectric material having conductive pathways (e.g., including conductive vias and lines) extending through the dielectric material between the faces of package substrate 406, or between different locations on each face. In some embodiments, package substrate 406 may have a thickness less than 1 millimeter (e.g., between 0.1 millimeters and 0.5 millimeters), although any number of package geometries can be used. Additional conductive contacts 412 may be disposed at an opposite face of package substrate 406 for conductively contacting, for instance, a printed circuit board (PCB). One or more vias 410 extend through a thickness of package substrate 406 to provide conductive pathways between one or more of connections 408 to one or more of contacts 412. Vias 410 are illustrated as single straight columns through package substrate 406 for ease of illustration, although other configurations can be used (e.g., damascene, dual damascene, through-silicon via, or an interconnect structure that meanders through the thickness of substrate 406 to contact one or more intermediate locations therein). In still other embodiments, vias 410 are fabricated by multiple smaller stacked vias, or are staggered at different locations across package substrate 406. In the illustrated embodiment, contacts 412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 412, to inhibit shorting.

In some embodiments, a mold material 414 may be disposed around the one or more dies 402 included within housing 404 (e.g., between dies 402 and package substrate 406 as an underfill material, as well as between dies 402 and housing 404 as an overfill material). Although the dimensions and qualities of the mold material 414 can vary from one embodiment to the next, in some embodiments, a thickness of mold material 414 is less than 1 millimeter. Example materials that may be used for mold material 414 include epoxy mold materials, as suitable. In some cases, the mold material 414 is thermally conductive, in addition to being electrically insulating.

Methodology

Figure 5:
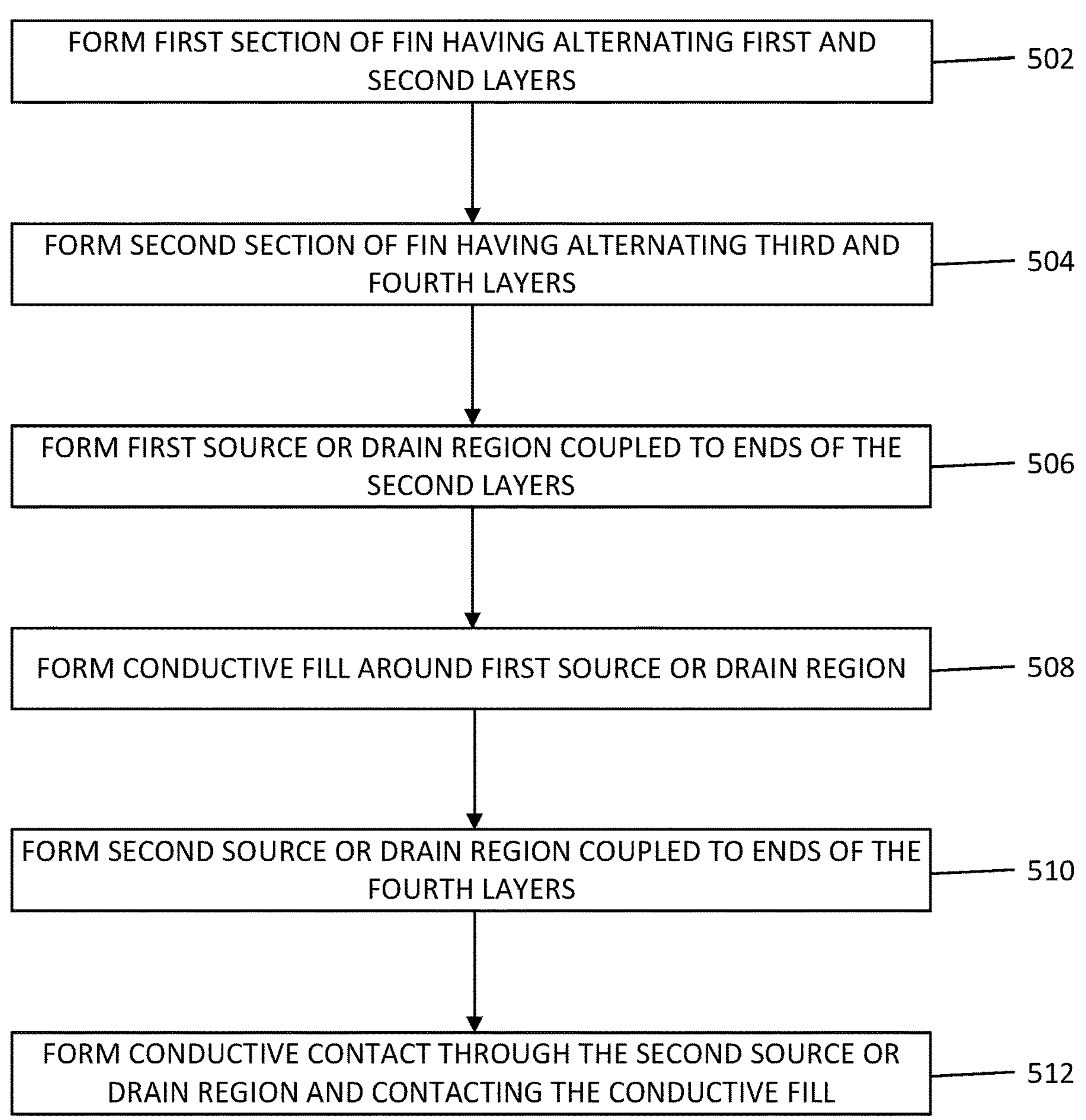
FIG. 5 is a flowchart of a fabrication process for a semiconductor device having a metalized source or drain region beneath a non-metalized source or drain region, in accordance with an embodiment of the present disclosure.

FIG. 5 is a flow chart of a method 500 for forming at least a portion of an integrated circuit, according to an embodiment. Various operations of method 500 may be illustrated in FIGS. 2A-2K. However, the correlation of the various operations of method 500 to the specific components illustrated in the aforementioned figures is not intended to imply any structural and/or use limitations. Rather, the aforementioned figures provide some example embodiments of method 500. Other operations may be performed before, during, or after any of the operations of method 500. Some of the operations of method 500 may be performed in a different order than the illustrated order.

Method 500 begins with operation 502 where a first section of a fin is formed having alternating first and second layers. The first layers may be sacrificial layers (e.g., comprising SiGe) while the second layers include a semiconductor material (e.g., Si, SiGe, Ge, InP, or GaAs) suitable for use as a nanoribbon channel. The first section may be formed over a substrate or over a sacrificial spacer layer. The thickness of each of the first and second layers may be between about 5 nm and about 20 nm or between about 5 nm and about 10 nm. Each of the first and second layers may be deposited using any known material deposition technique, such as CVD, PECVD, PVD, or ALD.

Method 500 continues with operation 504 where a second section of the fin is formed having alternating third and fourth layers. The third layers may be substantially the same as the first layers (sacrificial layers) with substantially the same thickness of the first layers. The fourth layers include a semiconductor material (e.g., Si, SiGe, Ge, InP, or GaAs) suitable for use as a nanoribbon channel and may include substantially the same material composition as the second layers. The thickness of each of the third and fourth layers may be between about 5 nm and about 20 nm or between about 5 nm and about 10 nm. Each of the third and fourth layers may be deposited using any known material deposition technique, such as CVD, PECVD, PVD, or ALD. According to some embodiments, the second fin section is separated from the first fin section by a sacrificial spacer layer that includes the same material composition as any of the first and third layers.

According to some embodiments, once the material layers have been deposited, one or more fins may be defined via an anisotropic etching process, such as RIE, using a patterned mask material to protect the fins from the etch. The fin height may include the alternating material layers of each of the fin sections and a subfin portion formed from the substrate material. In some other embodiments, trenches are first formed in a dielectric material and the alternating material layers of the aforementioned sections are formed within the trenches to form one or more multilayer fins. A separate fin used to define specific semiconductor devices may be further formed by patterning a sacrificial gate and gate spacer structures on sidewalls of the sacrificial gate that extend over the fin and removing portions of the fin outside of the sacrificial gate and gate spacer structures.

Method 500 continues with operation 506 where a first source or drain region is formed that is coupled to at least the ends of the second layers of the first fin section. The first source or drain region may be epitaxially grown from exposed tips of the second layers (e.g., grown from semiconductor seed material), while an internal dielectric spacer material fills a region between the second layers and adjacent to the ends of the second layers. A dielectric liner may be formed over the ends of at least the fourth layers to protect the semiconductor material of the fourth layers during the epitaxial growth of the first source or drain region.

Method 500 continues with operation 508 where a conductive fill is formed around the first source or drain region. According to some embodiments the conductive fill includes a continuous body of refractory metal, such as ruthenium (Ru), tungsten (W), cobalt (Co), or molybdenum (Mo). Such refractory metals do not react with the adjacent source or drain material, and thus no silicide or germanide forms at the boundary between the conductive fill and the semiconductor material of the first source or drain region. According to some embodiments, the refractory metal of the conductive fill directly contacts the epitaxial material of first source or drain region.

In some embodiments, the conductive fill includes any suitable non-reactive metal or metal compound. For example, some metal silicides like MoSi or TaSi can be reacted together in a gaseous state and deposited as the conductive fill. Since the compounds have already reacted, no further reaction takes place with the epi material of the source or drain regions. Accordingly, the conductive fill may include a consistent material composition of either a single refractory metal or non-reactive metal compound throughout the body of the conductive fill with no material gradient present at the interface between the conductive fill and the epi material of the first source or drain region.

According to some embodiments, the conductive fill may be formed via a combination of PVD and CVD processes. For example, a PVD process may be used first to deposit a layer of metal material followed by depositing the same metal material using a CVD process to complete the formation of the conductive fill. In some embodiments, no seam will be present between the metal material depositing using the different deposition processes (e.g., the conductive fill will appear to be a continuous body of conductive material). In some other embodiments, based on the deposition method and/or parameters, a seam may be visible between the metal deposited using PVD and the metal deposited using CVD. In some embodiments, an insulator layer may be formed over the conductive fill to separate the source or drain regions of the bottom device from the top device.

Method 500 continues with operation 510 where a second source or drain region is formed that is coupled to at least the ends of the fourth layers of the second fin section. At least a portion of the second source or drain region may be epitaxially grown from exposed tips of the fourth layers (e.g., grown from semiconductor seed material), while the internal dielectric spacer material fills a region between the fourth layers and adjacent to the ends of the fourth layers. In some embodiments, the second source or drain region includes an epitaxial fill material of a more highly doped semiconductor material compared to the semiconductor material grown from the ends of the fourth layers.

Method 500 continues with operation 512 where a conductive contact is formed that extends down through the second source or drain region towards the conductive fill. In some embodiments, the conductive contact extends through an entire thickness of the second source or drain region and through an entire thickness of the insulator layer (if present) before contacting a top surface of the conductive fill. The conductive contact may have a tapered profile and may include any suitably conductive material such as copper (Cu), ruthenium (Ru), tungsten (W), cobalt (Co), titanium (Ti), molybdenum (Mo), or any alloys thereof. In some embodiments, the conductive contact includes layers of different conductive materials, such as a liner that includes titanium silicide or nitrogen silicide and a fill material that includes tungsten or cobalt, to name a few examples. In some other embodiments, the conductive contact includes a refractory metal or non-reactive metal such as the same refractory metal or non-reactive metal as the conductive fill. Accordingly, the conductive contact and the conductive fill may appear as a seamless conductive body of the same metal material.

Figure 6:
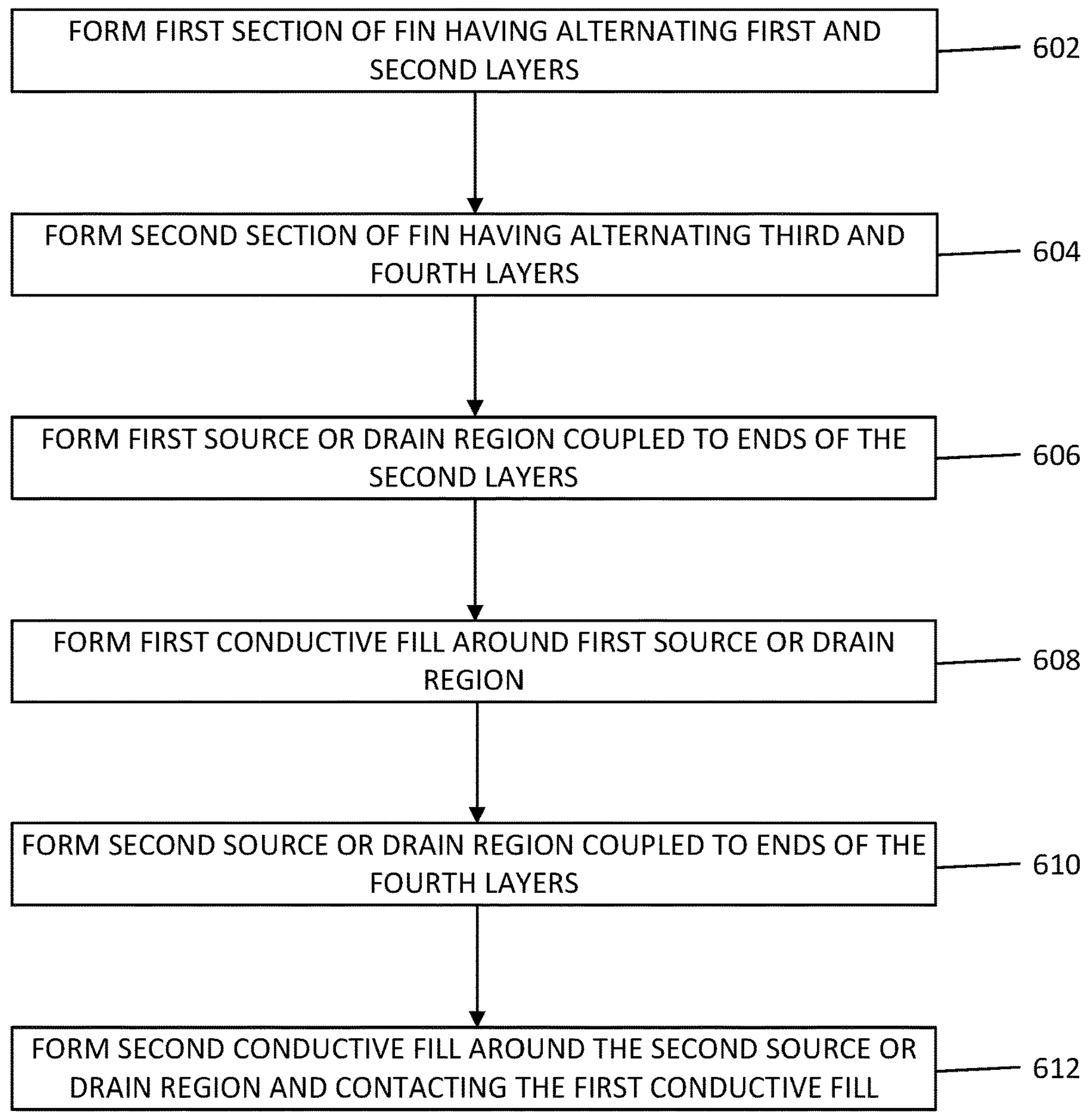
FIG. 6 is a flowchart of a fabrication process for a semiconductor device having a metalized source or drain region beneath another metalized source or drain region, in accordance with an embodiment of the present disclosure.

FIG. 6 is a flow chart of another method 600 for forming at least a portion of an integrated circuit, according to an embodiment. Various operations of method 600 may be illustrated in FIGS. 3A-3C. However, the correlation of the various operations of method 600 to the specific components illustrated in the aforementioned figures is not intended to imply any structural and/or use limitations. Rather, the aforementioned figures provide some example embodiments of method 600. Other operations may be performed before, during, or after any of the operations of method 600. Some of the operations of method 600 may be performed in a different order than the illustrated order.

Method 600 begins with operation 602 where a first section of a fin is formed having alternating first and second layers. The first layers may be sacrificial layers (e.g., comprising SiGe) while the second layers include a semiconductor material (e.g., Si, SiGe, Ge, InP, or GaAs) suitable for use as a nanoribbon channel. The first section may be formed over a substrate or over a sacrificial spacer layer. The thickness of each of the first and second layers may be between about 5 nm and about 20 nm or between about 5 nm and about 10 nm. Each of the first and second layers may be deposited using any known material deposition technique, such as CVD, PECVD, PVD, or ALD.

Method 600 continues with operation 604 where a second section of the fin is formed having alternating third and fourth layers. The third layers may be substantially the same as the first layers (sacrificial layers) with substantially the same thickness of the first layers. The fourth layers include a semiconductor material (e.g., Si, SiGe, Ge, InP, or GaAs) suitable for use as a nanoribbon channel and may include substantially the same material composition as the second layers. The thickness of each of the third and fourth layers may be between about 5 nm and about 20 nm or between about 5 nm and about 10 nm. Each of the third and fourth layers may be deposited using any known material deposition technique, such as CVD, PECVD, PVD, or ALD. According to some embodiments, the second fin section is separated from the first fin section by a sacrificial spacer layer that includes the same material composition as any of the first and third layers.

According to some embodiments, once the material layers have been deposited, one or more fins may be defined via an anisotropic etching process, such as RIE, using a patterned mask material to protect the fins from the etch. The fin height may include the alternating material layers of each of the fin sections and a subfin portion formed from the substrate material. In some other embodiments, trenches are first formed in a dielectric material and the alternating material layers of the aforementioned sections are formed within the trenches to form one or more multilayer fins. A separate fin used to define specific semiconductor devices may be further formed by patterning a sacrificial gate and gate spacer structures on sidewalls of the sacrificial gate that extend over the fin and removing portions of the fin outside of the sacrificial gate and gate spacer structures.

Method 600 continues with operation 606 where a first source or drain region is formed that is coupled to at least the ends of the second layers of the first fin section. At least a portion of the first source or drain region may be epitaxially grown from exposed tips of the second layers (e.g., grown from semiconductor seed material), while an internal dielectric spacer material fills a region between the second layers and adjacent to the ends of the second layers. A dielectric liner may be formed over the ends of at least the fourth layers to protect the semiconductor material of the fourth layers during the epitaxial growth of the first source or drain region.

Method 600 continues with operation 608 where a first conductive fill is formed around the first source or drain region. According to some embodiments the first conductive fill includes a continuous body of refractory metal, such as ruthenium (Ru), tungsten (W), cobalt (Co), or molybdenum (Mo). Such refractory metals do not react with the adjacent source or drain material, and thus no silicide or germanide forms at the boundary between the first conductive fill and the semiconductor material of the first source or drain region. According to some embodiments, the refractory metal of the first conductive fill directly contacts the epitaxial material of the first source or drain region.

In some embodiments, the first conductive fill includes any suitable non-reactive metal or metal compound. For example, some metal silicides like MoSi or TaSi can be reacted together in a gaseous state and deposited as the first conductive fill. Since the compounds have already reacted, no further reaction takes place with the epi material of the source or drain regions. Accordingly, the first conductive fill may include a consistent material composition of either a single refractory metal or non-reactive metal compound throughout the body of the first conductive fill with no material gradient present at the interface between the first conductive fill and the epi material of the first source or drain region.

According to some embodiments, the first conductive fill may be formed via a combination of PVD and CVD processes. For example, a PVD process may be used first to deposit a layer of metal material followed by depositing the same metal material using a CVD process to complete the formation of the first conductive fill. In some embodiments, no seam will be present between the metal material depositing using the different deposition processes (e.g., the first conductive fill will appear to be a continuous body of conductive material). In some other embodiments, based on the deposition method and/or parameters, a seam may be visible between the metal deposited using PVD and the metal deposited using CVD. In some embodiments, an insulator layer may be formed over the first conductive fill to separate the source or drain regions of the bottom device from the top device.

Method 600 continues with operation 610 where a second source or drain region is formed that is coupled to at least the ends of the fourth layers of the second fin section. The second source or drain region may be epitaxially grown from exposed tips of the fourth layers (e.g., grown from semiconductor seed material), while the internal dielectric spacer material fills a region between the fourth layers and adjacent to the ends of the fourth layers. The second source or drain region may include a higher dopant concentration of an opposite dopant type (e.g., n-type vs. p-type) compared to the first source or drain region.

Method 600 continues with operation 612 where a second conductive fill is formed around the second source or drain region and on a top surface of the first conductive fill. If an insulator layer is present over the first conductive fill, a recess may be first etched through the insulator layer such that the second conductive fill also fills in the recess and contacts a portion of the top surface of the first conductive fill. According to some embodiments the second conductive fill includes a continuous body of refractory metal, such as ruthenium (Ru), tungsten (W), cobalt (Co), or molybdenum (Mo). Like, first conductive fill, second conductive fill may include metal silicides like MoSi or TaSi that are reacted together in a gaseous state and deposited as the second conductive fill, such that the metal compounds are no longer reactive. In some examples, the second conductive fill includes the same metal material as the first conductive fill. Accordingly, the first and second conductive fills may appear as a single continuous body of metal with no seam present between the two structures. The refractory or otherwise non-reactive metal of the second conductive fill does not react with the adjacent second source or drain region, and thus no silicide or germanide forms at the boundary between the second conductive fill and the semiconductor material of the second source or drain region. According to some embodiments, the refractory metal of the second conductive fill directly contacts the epitaxial material of the second source or drain region.

Example System

Figure 7:
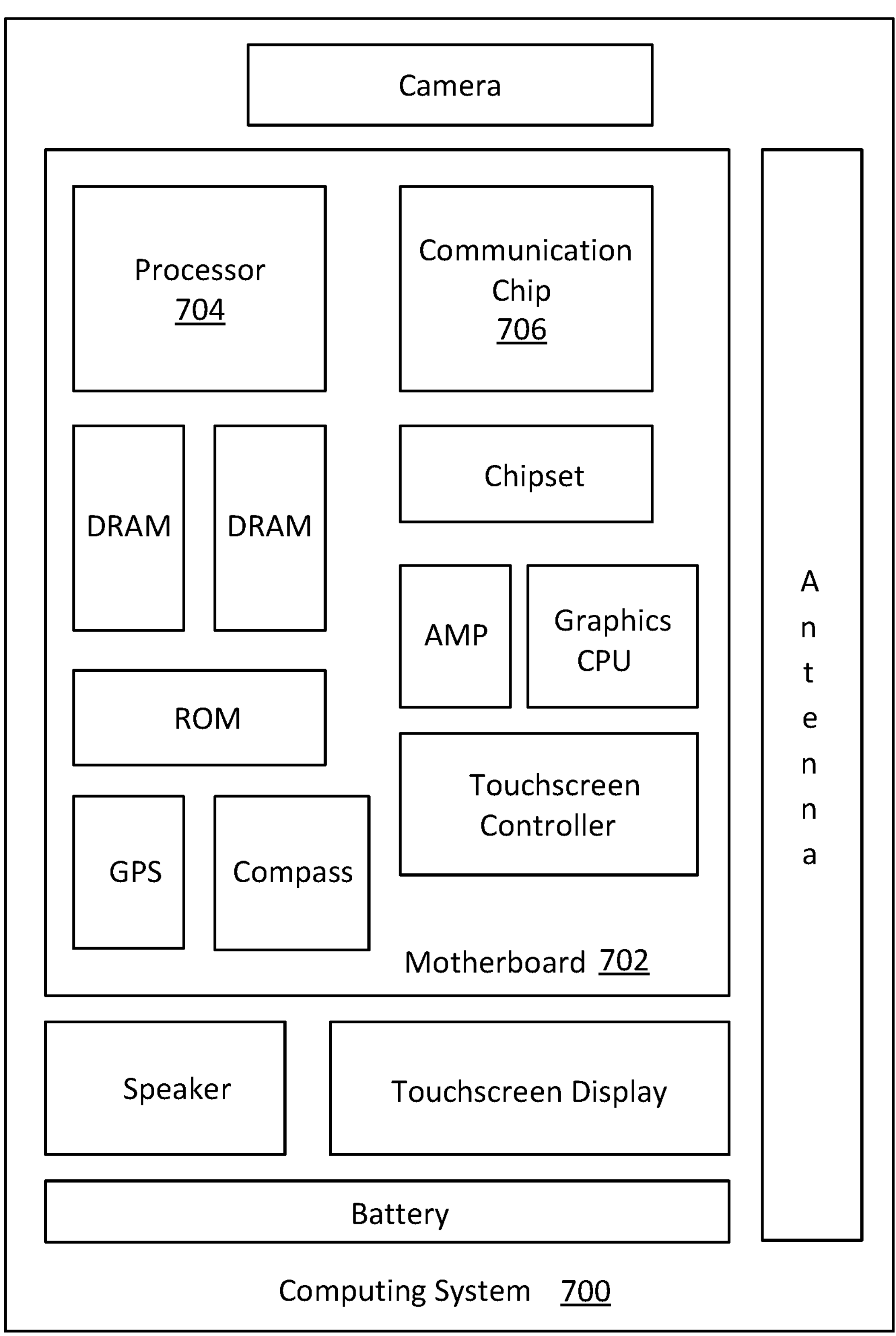
FIG. 7 illustrates a computing system including one or more integrated circuits, as variously described herein, in accordance with an embodiment of the present disclosure.

FIG. 7 is an example computing system implemented with one or more of the integrated circuit structures as disclosed herein, in accordance with some embodiments of the present disclosure. As can be seen, the computing system 700 houses a motherboard 702. The motherboard 702 may include a number of components, including, but not limited to, a processor 704 and at least one communication chip 706, each of which can be physically and electrically coupled to the motherboard 702, or otherwise integrated therein. As will be appreciated, the motherboard 702 may be, for example, any printed circuit board (PCB), whether a main board, a daughterboard mounted on a main board, or the only board of system 700, etc.

Depending on its applications, computing system 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures or devices configured in accordance with an example embodiment (e.g., a module including an integrated circuit device on a substrate, the substrate having a stacked configuration of semiconductor devices, as variously provided herein). In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing system 700 includes an integrated circuit die packaged within the processor 704. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 706 also may include an integrated circuit die packaged within the communication chip 706. In accordance with some such example embodiments, the integrated circuit die of the communication chip includes one or more semiconductor devices as variously described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 700 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a first semiconductor device having one or more first semiconductor nanoribbons extending in a first direction between a first source or drain region and a second source or drain region, and a second semiconductor device having one or more second semiconductor nanoribbons extending in the first direction between a third source or drain region and a fourth source or drain region. The one or more second semiconductor nanoribbons are spaced vertically from the one or more first semiconductor nanoribbons in a second direction different from the first direction, and the third source or drain region is spaced vertically from the first source or drain region in the second direction. The integrated circuit further includes an insulator layer between the first source or drain region and the third source or drain region, a conductive fill comprising a metal and contacting at least a portion of the first source or drain region and at least a portion of the insulator layer, and a conductive contact that extends through a thickness of the third source or drain region and contacts a portion of the conductive fill.

Example 2 includes the subject matter of Example 1, wherein the one or more first semiconductor nanoribbons and the one or more second semiconductor nanoribbons comprise germanium, silicon, or any combination thereof.

Example 3 includes the subject matter of Example 1 or 2, wherein the one or more first semiconductor nanoribbons is n-type silicon and the one or more second semiconductor nanoribbons is p-type silicon.

Example 4 includes the subject matter of any one of Examples 1-3, wherein a vertical distance between the one or more first semiconductor nanoribbons and the one or more second semiconductor nanoribbons is between about 10 nm and about 80 nm.

Example 5 includes the subject matter of any one of Examples 1-4, wherein the metal of the conductive fill comprises a refractory metal.

Example 6 includes the subject matter of Example 5, wherein the refractory metal is any one of tungsten (W), molybdenum (Mo), ruthenium (Ru), or cobalt (Co).

Example 7 includes the subject matter of any one of Examples 1-6, wherein the conductive contact comprises a refractory metal.

Example 8 includes the subject matter of Example 7, wherein the refractory metal is any one of tungsten (W), molybdenum (Mo), ruthenium (Ru), or cobalt (Co).

Example 9 includes the subject matter of any one of Examples 1-8, wherein the conductive contact extends through an entire thickness of the insulator layer.

Example 10 includes the subject matter of any one of Examples 1-9, wherein the third source or drain region includes one or more first regions that contact corresponding second semiconductor nanoribbons and a second region that contacts each of the one or more first regions, wherein the second region has a higher dopant concentration than each of the one or more first regions.

Example 11 includes the subject matter of Example 10, wherein the conductive contact extends through the second region and does not contact at least one of the one or more first regions.

Example 12 includes the subject matter of Example 10 or 11, wherein the conductive contact does not contact any of the one or more first regions.

Example 13 is a printed circuit board comprising the integrated circuit of any of Examples 1-12.

Example 14 is an electronic device that includes a chip package comprising one or more dies. At least one of the one or more dies includes a first semiconductor device having one or more first semiconductor nanoribbons extending in a first direction between a first source or drain region and a second source or drain region, and a second semiconductor device having one or more second semiconductor nanoribbons extending in the first direction between a third source or drain region and a fourth source or drain region. The one or more second semiconductor nanoribbons are spaced vertically from the one or more first semiconductor nanoribbons in a second direction different from the first direction, and the third source or drain region is spaced vertically from the first source or drain region in the second direction. The integrated circuit further includes an insulator layer between the first source or drain region and the third source or drain region, a conductive fill comprising a metal and contacting at least a portion of the first source or drain region and at least a portion of the insulator layer, and a conductive contact that extends through a thickness of the third source or drain region and contacts a portion of the conductive fill.

Example 15 includes the subject matter of Example 14, wherein the one or more first semiconductor nanoribbons and the one or more second semiconductor nanoribbons comprise germanium, silicon, or any combination thereof.

Example 16 includes the subject matter of Example 14 or 15, wherein the one or more first semiconductor nanoribbons is n-type silicon and the one or more second semiconductor nanoribbons is p-type silicon.

Example 17 includes the subject matter of any one of Examples 14-16, wherein a vertical distance between the one or more first semiconductor nanoribbons and the one or more second semiconductor nanoribbons is between about 10 nm and about 80 nm.

Example 18 includes the subject matter of any one of Examples 14-17, wherein the metal of the conductive fill comprises a refractory metal.

Example 19 includes the subject matter of Example 18, wherein the refractory metal is any one of tungsten (W), molybdenum (Mo), ruthenium (Ru), or cobalt (Co).

Example 20 includes the subject matter of any one of Examples 14-19, wherein the conductive contact comprises a refractory metal.

Example 21 includes the subject matter of Example 20, wherein the refractory metal is any one of tungsten (W), molybdenum (Mo), ruthenium (Ru), or cobalt (Co).

Example 22 includes the subject matter of any one of Examples 14-21, wherein the conductive contact extends through an entire thickness of the insulator layer.

Example 23 includes the subject matter of any one of Examples 14-22, wherein the third source or drain region includes one or more first regions that contact corresponding second semiconductor nanoribbons and a second region that contacts each of the one or more first regions, wherein the second region has a higher dopant concentration than each of the one or more first regions.

Example 24 includes the subject matter of Example 23, wherein the conductive contact extends through the second region and does not contact at least one of the one or more first regions.

Example 25 includes the subject matter of Example 23 or 24, wherein the conductive contact does not contact any of the one or more first regions.

Example 26 includes the subject matter of any one of Examples 14-25, further comprising a printed circuit board, wherein the chip package is attached to the printed circuit board.

Example 27 is an integrated circuit that includes a first semiconductor device having one or more first semiconductor nanoribbons extending in a first direction and a second semiconductor device having one or more second semiconductor nanoribbons extending in the first direction. The one or more second semiconductor nanoribbons are spaced vertically from the one or more first semiconductor nanoribbons in a second direction different from the first direction. The integrated circuit also includes a first source or drain epitaxial region on an end of at least one of the one or more first semiconductor nanoribbons, a second source or drain epitaxial region on an end of at least one of the one or more second semiconductor nanoribbons, a conductive fill comprising a metal and around both the first source or drain epitaxial region and the second source or drain epitaxial region, and a conductive via that contacts a portion of the conductive fill.

Example 28 includes the subject matter of Example 27, wherein the one or more first semiconductor nanoribbons and the one or more second semiconductor nanoribbons comprise germanium, silicon, or any combination thereof.

Example 29 includes the subject matter of Example 27 or 28, wherein the one or more first semiconductor nanoribbons is n-type silicon and the one or more second semiconductor nanoribbons is p-type silicon.

Example 30 includes the subject matter of any one of Examples 27-29, wherein a vertical distance between the one or more first semiconductor nanoribbons and the one or more second semiconductor nanoribbons is between about 10 nm and about 80 nm.

Example 31 includes the subject matter of any one of Examples 27-30, wherein the metal of the conductive fill comprises a refractory metal.

Example 32 includes the subject matter of Example 31, wherein the refractory metal is any one of tungsten (W), molybdenum (Mo), ruthenium (Ru), or cobalt (Co).

Example 33 includes the subject matter of any one of Examples 27-32, further comprising an insulator layer between the first source or drain region and the second source or drain region, wherein the conductive fill extends through an entire thickness of the insulator layer.

Example 34 includes the subject matter of any one of Examples 27-33, wherein the first source or drain region is on an end of only one of the one or more first semiconductor nanoribbons and the second source or drain region is on an end of only one of the one or more second semiconductor nanoribbons.

Example 35 is a printed circuit board comprising the integrated circuit of any one of Examples 27-34.

Example 36 is a method of forming an integrated circuit. The method includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a first source or drain region coupled to the ends of the second material layers; forming a conductive fill comprising a metal and contacting at least a portion of the first source or drain region; forming an insulating layer over the conductive fill; forming a second source or drain region coupled to the ends of the fourth material layers and over the insulating layer; and forming a conductive contact through a thickness of the second source or drain region and through at least a portion of the insulating layer, such that the conductive contact contacts the conductive fill.

Example 37 includes the subject matter of Example 36, wherein the first and third material layers comprise silicon and germanium and the second and fourth material layers comprise silicon.

Example 38 includes the subject matter of Example 36 or 37, wherein the second section of the fin is separated from the first section of the fin by a vertical distance between about 10 nm and about 80 nm.

Example 39 includes the subject matter of any one of Examples 36-38, further comprising removing the first and third material layers.

Example 40 includes the subject matter of any one of Examples 36-39, wherein the metal of the conductive fill is a refractory metal.

Example 41 is a method of forming an integrated circuit. The method includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a first source or drain region coupled to at least one of the ends of the second material layers; forming a first conductive fill comprising a metal and contacting at least a portion of the first source or drain region; forming a second source or drain region coupled to at least one of the ends of the fourth material layers; and forming a second conductive fill comprising the metal and contacting at least a portion of the second source or drain region and the first conductive fill.

Example 42 includes the subject matter of Example 41, wherein the first and third material layers comprise silicon and germanium and the second and fourth material layers comprise silicon.

Example 43 includes the subject matter of Example 41 or 42, wherein the second section of the fin is separated from the first section of the fin by a vertical distance between about 10 nm and about 80 nm.

Example 44 includes the subject matter of any one of Examples 41-43, further comprising removing the first and third material layers.

Example 45 includes the subject matter of any one of Examples 41-44, wherein the metal of the first and second conductive fill is a refractory metal.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:
- a first semiconductor device having one or more first semiconductor nanoribbons extending in a first direction;
- a second semiconductor device having one or more second semiconductor nanoribbons extending in the first direction, wherein the one or more second semiconductor nanoribbons are spaced vertically from the one or more first semiconductor nanoribbons in a second direction different from the first direction;
- a first source or drain epitaxial region on an end of at least one of the one or more first semiconductor nanoribbons;
- a second source or drain epitaxial region on an end of at least one of the one or more second semiconductor nanoribbons;
- an insulator layer between the first source or drain region and the second source or drain region;
- a conductive fill comprising a metal and contacting both the first source or drain epitaxial region and the insulator layer, wherein the conductive fill directly contacts a bottommost surface of the first source or drain epitaxial region; and
- a conductive contact that extends through an entire thickness of the insulator layer and contacts a portion of the conductive fill.

2. The integrated circuit of claim 1, wherein the conductive contact extends in the second direction along an entire height of the second source or drain epitaxial region.

3. The integrated circuit of claim 1, wherein the first source or drain region is on an end of only one of the one or more first semiconductor nanoribbons and the second source or drain region is on an end of only one of the one or more second semiconductor nanoribbons.

4. The integrated circuit of claim 1, wherein the metal of the conductive fill comprises a refractory metal.

5. The integrated circuit of claim 4, wherein the refractory metal is any one of tungsten (W), molybdenum (Mo), ruthenium (Ru), or cobalt (Co).

6. An electronic device, comprising:
- a chip package comprising a die, the die comprising
  - a first semiconductor device having one or more first semiconductor nanoribbons extending in a first direction between a first source or drain region and a second source or drain region;
  - a second semiconductor device having one or more second semiconductor nanoribbons extending in the first direction between a third source or drain region and a fourth source or drain region, wherein the one or more second semiconductor nanoribbons are spaced vertically from the one or more first semiconductor nanoribbons in a second direction different from the first direction, and the third source or drain region is spaced vertically from the first source or drain region in the second direction;
  - an insulator layer between the first source or drain region and the third source or drain region;
  - a conductive fill comprising a metal and contacting at least a portion of the first source or drain region and at least a portion of the insulator layer, wherein the conductive fill directly contacts a bottommost surface of the first source or drain region; and
  - a conductive contact that extends through a thickness of the third source or drain region and contacts a portion of the conductive fill.

7. The electronic device of claim 6, wherein the metal of the conductive fill comprises a refractory metal.

8. The electronic device of claim 6, wherein the conductive contact comprises a refractory metal.

9. The electronic device of claim 6, wherein the conductive contact extends through an entire thickness of the insulator layer.

10. The electronic device of claim 6, wherein the third source or drain region includes one or more first regions that contact corresponding second semiconductor nanoribbons and a second region that contacts each of the one or more first regions, wherein the second region has a higher dopant concentration than each of the one or more first regions.

11. The electronic device of claim 10, wherein the conductive contact does not contact any of the one or more first regions.

12. An integrated circuit, comprising:
- a first semiconductor device having one or more first semiconductor nanoribbons extending in a first direction between a first source or drain region and a second source or drain region;
- a second semiconductor device having one or more second semiconductor nanoribbons extending in the first direction between a third source or drain region and a fourth source or drain region, wherein the one or more second semiconductor nanoribbons are spaced vertically from the one or more first semiconductor nanoribbons in a second direction different from the first direction, and the third source or drain region is spaced vertically from the first source or drain region in the second direction;

an insulator layer between the first source or drain region and the third source or drain region;

a conductive fill comprising a metal and contacting at least a portion of the first source or drain region and at least a portion of the insulator layer, wherein the conductive fill directly contacts a bottommost surface of the first source or drain region; and a conductive contact that extends through a thickness of the third source or drain region and contacts a portion of the conductive fill.

13. The integrated circuit of claim 12, wherein a vertical distance between the one or more first semiconductor nanoribbons and the one or more second semiconductor nanoribbons is between about 10 nm and about 80 nm.

14. The integrated circuit of claim 12, wherein the metal of the conductive fill is any one of tungsten (W), molybdenum (Mo), ruthenium (Ru), or cobalt (Co).

15. The integrated circuit of claim 12, wherein the conductive contact comprises any one of tungsten (W), molybdenum (Mo), ruthenium (Ru), or cobalt (Co).

16. The integrated circuit of claim 12, wherein the conductive contact extends through an entire thickness of the insulator layer.

17. A die comprising the integrated circuit of claim 12.

18. The integrated circuit of claim 12, wherein the third source or drain region includes one or more first regions that contact corresponding second semiconductor nanoribbons and a second region that contacts each of the one or more first regions, wherein the second region has a higher dopant concentration than each of the one or more first regions.

19. The integrated circuit of claim 18, wherein the conductive contact does not contact any of the one or more first regions.

* * * * *